US012382639B2

(12) United States Patent
Yang et al.

(10) Patent No.: US 12,382,639 B2
(45) Date of Patent: Aug. 5, 2025

(54) THREE-DIMENSIONAL MEMORY DEVICE AND METHOD

(71) Applicant: Taiwan Semiconductor Manufacturing Co., Ltd., Hsinchu (TW)

(72) Inventors: TsuChing Yang, Hsinchu (TW); Hung-Chang Sun, Kaohsiung (TW); Kuo Chang Chiang, Hsinchu (TW); Sheng-Chih Lai, Hsinchu (TW); Yu-Wei Jiang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 32 days.

(21) Appl. No.: 18/526,663

(22) Filed: Dec. 1, 2023

(65) Prior Publication Data

US 2024/0114690 A1  Apr. 4, 2024

Related U.S. Application Data

(62) Division of application No. 17/194,715, filed on Mar. 8, 2021, now Pat. No. 11,856,781.

(Continued)

(51) Int. Cl.
*H10B 51/20* (2023.01)
*H10B 51/10* (2023.01)
*H10D 62/10* (2025.01)

(52) U.S. Cl.
CPC ............. *H10B 51/20* (2023.02); *H10B 51/10* (2023.02); *H10D 62/115* (2025.01)

(58) Field of Classification Search
CPC ........ H10B 51/10; H10B 51/20; H10B 51/30; H10D 62/115
See application file for complete search history.

(56) References Cited

U.S. PATENT DOCUMENTS 9,053,976 B2  6/2015  Ernst et al.
9,748,266 B1  8/2017  Baraskar et al.
(Continued)

FOREIGN PATENT DOCUMENTS

CN   109075174 A   12/2018
CN   110462829 A   11/2019
(Continued)

*Primary Examiner* — Matthew E Warren
(74) *Attorney, Agent, or Firm* — Slater Matsil, LLP

(57) ABSTRACT

A method of forming a three-dimensional (3D) memory device includes: forming, over a substrate, a layer stack having alternating layers of a first conductive material and a first dielectric material; forming trenches extending vertically through the layer stack from an upper surface of the layer stack distal from the substrate to a lower surface of the layer stack facing the substrate; lining sidewalls and bottoms of the trenches with a memory film; forming a channel material over the memory film, the channel material including an amorphous material; filling the trenches with a second dielectric material after forming the channel material; forming memory cell isolation regions in the second dielectric material; forming source lines (SLs) and bit lines (BLs) that extend vertically in the second dielectric material on opposing sides of the memory cell isolation regions; and crystallizing first portions of the channel material after forming the SLs and BLs.

20 Claims, 20 Drawing Sheets

Related U.S. Application Data

(60) Provisional application No. 63/055,032, filed on Jul. 22, 2020.

(56) References Cited

U.S. PATENT DOCUMENTS

| | | | |
|---|---|---|---|
| 9,911,754 B1 * | 3/2018 | Guo | H10D 64/693 |
| 10,224,340 B2 | 3/2019 | Hada et al. | |
| 10,777,566 B2 | 9/2020 | Lue | |
| 10,868,031 B2 | 12/2020 | Liu et al. | |
| 2010/0194719 A1 | 8/2010 | Saitoh et al. | |
| 2013/0273724 A1 | 10/2013 | Joo et al. | |
| 2015/0079743 A1 | 3/2015 | Pachamuthu et al. | |
| 2017/0330752 A1 * | 11/2017 | Kim | H01L 21/30604 |
| 2018/0350837 A1 | 12/2018 | Yoo et al. | |
| 2019/0148393 A1 | 5/2019 | Lue | |
| 2019/0393353 A1 | 12/2019 | Jeong et al. | |
| 2020/0006376 A1 * | 1/2020 | Makala | H10B 43/20 |
| 2020/0026990 A1 | 1/2020 | Lue | |
| 2020/0075631 A1 | 3/2020 | Dong et al. | |
| 2020/0335514 A1 | 10/2020 | Xu et al. | |
| 2021/0257407 A1 * | 8/2021 | Han | H10N 70/8828 |
| 2021/0280428 A1 * | 9/2021 | Zhang | H01L 21/02236 |
| 2021/0399052 A1 * | 12/2021 | Wu | H10D 30/701 |

FOREIGN PATENT DOCUMENTS

| | | | | |
|---|---|---|---|---|
| KR | 20160004470 A * | 1/2016 | | H10B 51/30 |
| KR | 20180059271 A * | 6/2018 | | H10B 51/20 |
| KR | 20190066489 A | 6/2019 | | |
| TW | 201834215 A | 9/2018 | | |
| TW | 201931577 A | 8/2019 | | |
| WO | 2010004047 A1 | 1/2010 | | |
| WO | 2018136730 A1 | 7/2018 | | |
| WO | 2018144957 A1 | 8/2018 | | |
| WO | WO-2021173176 A1 * | 9/2021 | | G11C 11/223 |

* cited by examiner

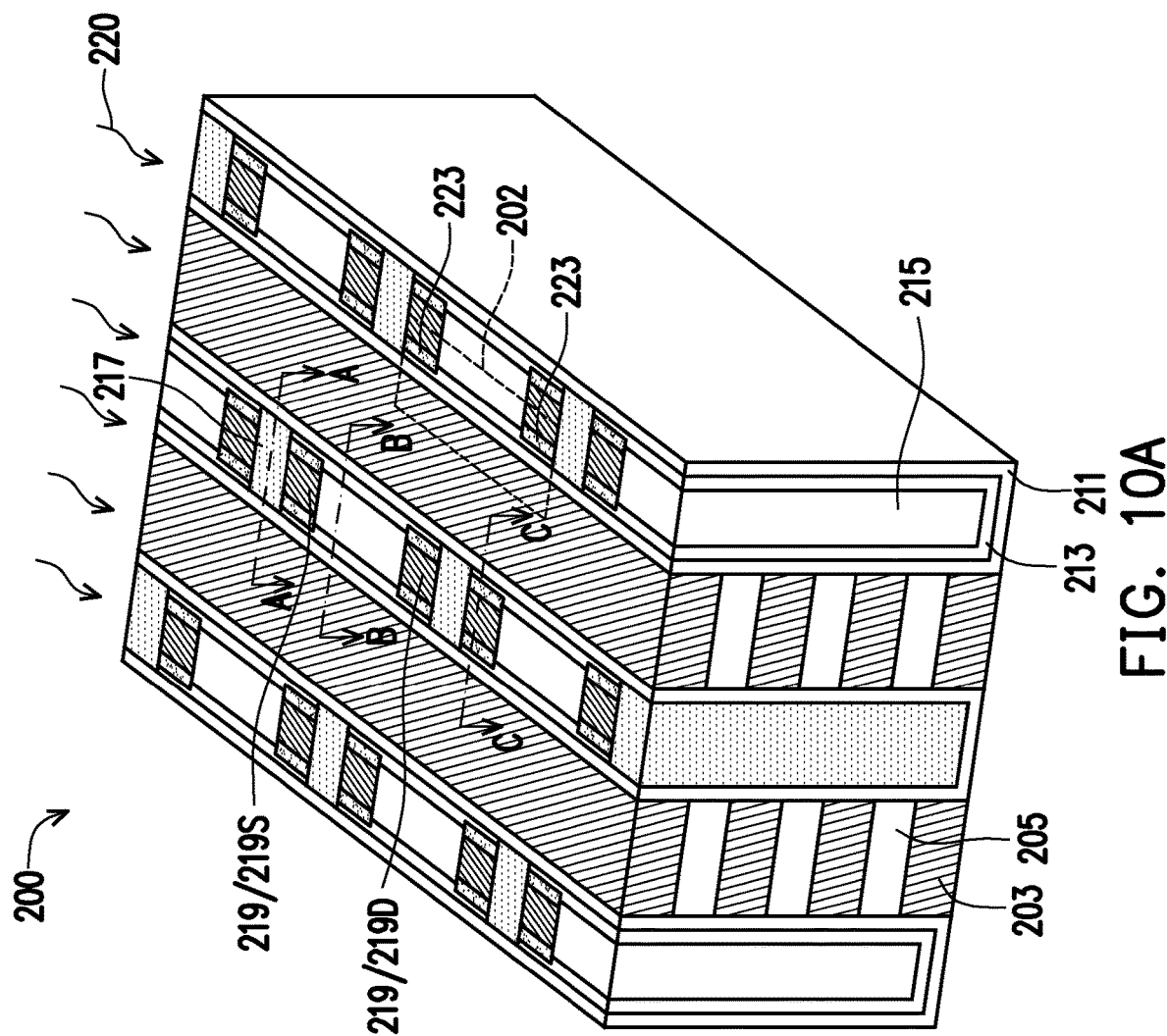

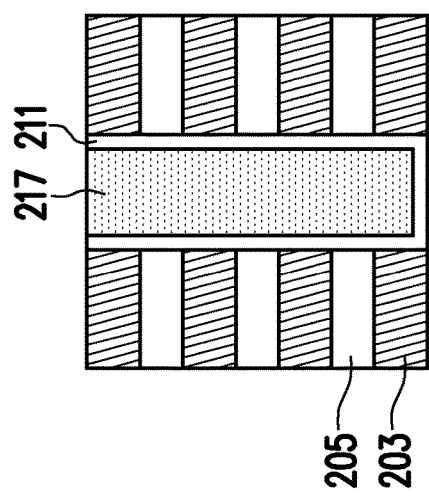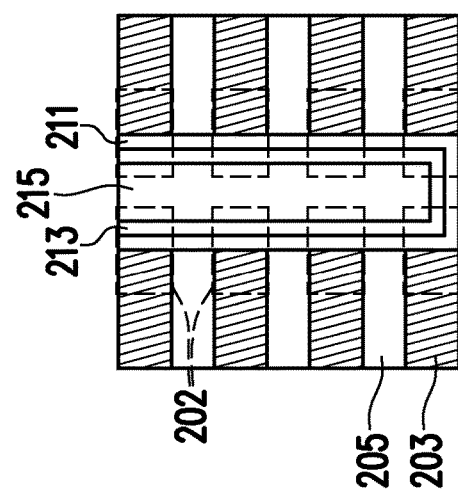

THREE-DIMENSIONAL MEMORY DEVICE AND METHOD

PRIORITY CLAIM AND CROSS-REFERENCE

This application is a divisional of U.S. patent application Ser. No. 17/194,715, filed Mar. 8, 2021, entitled "Three-Dimensional Memory Device and Method," which claims the benefit of U.S. Provisional Application No. 63/055,032, filed on Jul. 22, 2020, which applications are hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them without power being supplied. One type of non-volatile semiconductor memory is ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-8, 9A, 9B, and 10A-10J illustrate various views of a three-dimensional (3D) memory device at various stages of manufacturing, in an embodiment.

DETAILED DESCRIPTION

Figure 1:
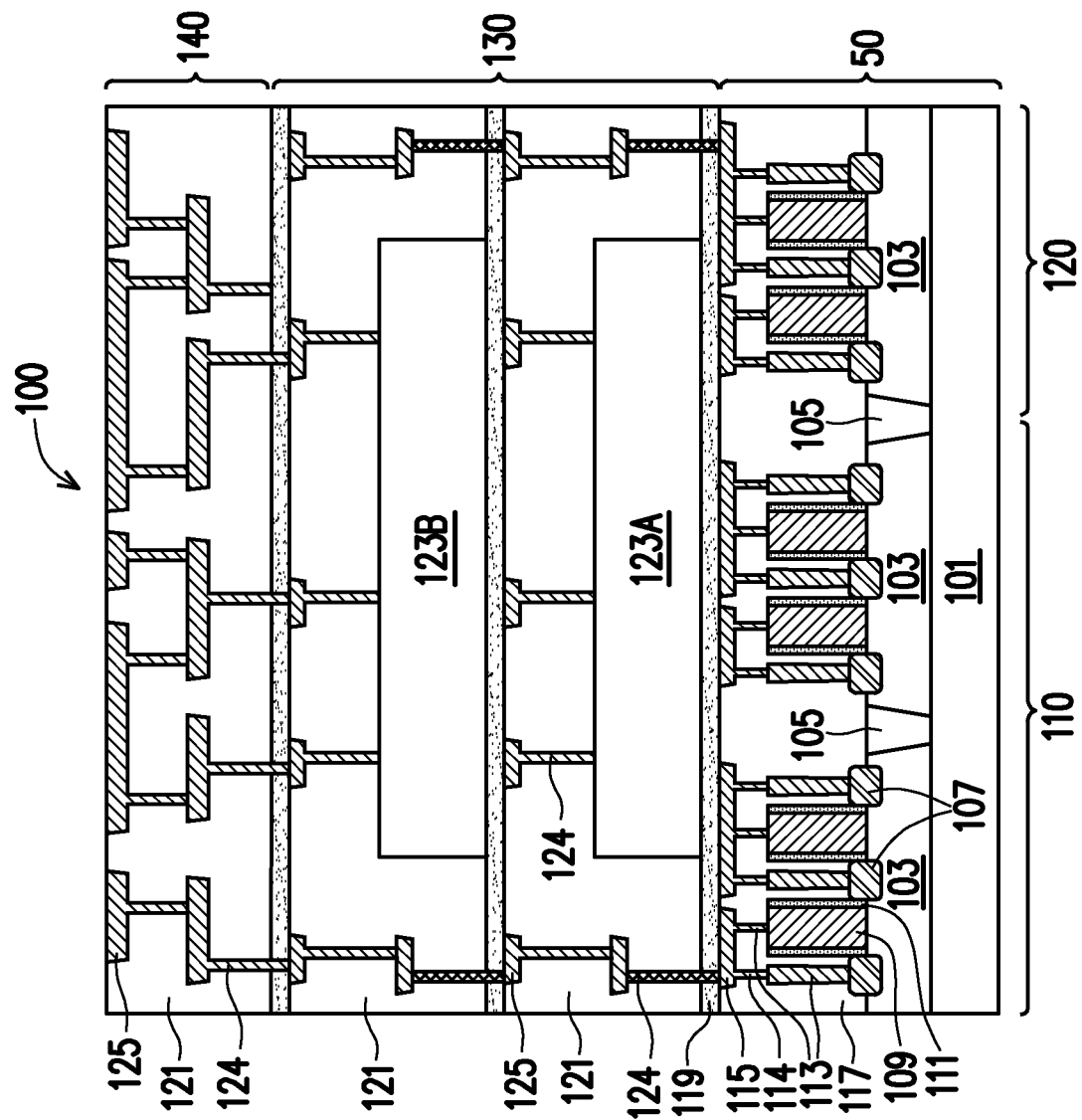
FIG. 1 illustrates a cross-sectional view of a semiconductor device with integrated memory devices, in an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numeral in different figures refers to the same or similar element formed by a same or similar process using a same or similar material(s).

In some embodiments, a method of forming a three-dimensional (3D) memory device includes: forming trenches extending through a layer stack that includes alternating layers of a first conductive material and a first dielectric material; lining sidewalls and bottoms of the trenches with a memory film; conformally forming a channel material over the memory film, the channel material comprising an amorphous material; and filling the trenches with a second dielectric material after forming the channel material. The method further includes forming memory cell isolation regions in the second dielectric material; forming source lines (SLs) and bit lines (BLs) in the second dielectric material on opposing sides of the memory cell isolation regions; and crystallizing first portions of the channel material after forming the SLs and BLs. In some embodiments, a thermal treatment is performed to crystallize the first portions of the channel material that contact the SLs and BLs. The crystallized first portions of the channel material has lower electrical resistance, thereby reducing the contact resistance between the gate and the channel material of the thin film transistor (TFT) of the memory cell and improving the driving capability of the TFT.

FIG. 1 illustrates a cross-sectional view of a semiconductor device 100 with integrated memory devices 123 (e.g., 123A and 123B), in an embodiment. The semiconductor device 100 is a fin-field effect transistor (FinFET) device with three-dimensional (3D) memory devices 123 integrated in the back-end-of-line (BEOL) processing of semiconductor manufacturing, in the illustrated embodiment. Note that FinFETs are used as a non-limiting example here. The 3D memory devices 123 (may also be referred to as memory devices 123) may be integrated in any suitable devices, such as semiconductor devices with planar transistors or gate-all-around (GAA) transistors. To avoid clutter, details of the memory devices 123 are not shown in FIG. 1, but are illustrated in subsequent figures hereinafter.

As illustrated in FIG. 1, the semiconductor device 100 includes different regions for forming different types of circuits. For example, the semiconductor device 100 may include a first region 110 for forming logic circuits, and may include a second region 120 for forming, e.g., peripheral circuits, input/output (I/O) circuits, electrostatic discharge (ESD) circuits, and/or analog circuits. Other regions for forming other types of circuits are possible and are fully intended to be included within the scope of the present disclosure.

The semiconductor device 100 includes a substrate 101. The substrate 101 may be a bulk substrate, such as a silicon substrate, doped or undoped, or an active layer of a semiconductor-on-insulator (SOI) substrate. The substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Electrical components, such as transistors, resistors, capacitors, inductors, diodes, or the like, are formed in or on the substrate 101 in the front-end-of-line (FEOL) processing of semiconductor manufacturing. In the example of FIG. 1, semiconductor fins 103 (also referred to as fins) are formed protruding above the substrate 101. Isolation regions 105, such as shallow-trench isolation (STI) regions, are formed between or around the semiconductor fins 103. Gate electrodes 109 are formed over the semiconductor fins 103. Gate spacers 111 are formed along sidewalls of the gate electrodes 109. Source/drain regions 107, such as epitaxial source/drain regions, are formed on opposing sides of the gate electrodes 109. Contacts 113, such as gate contacts and source/drain contacts, are formed over and electrically coupled to respective underlying electrically conductive features (e.g., gate electrodes 109 or source/drain regions 107). One or more dielectric layers 117, such as an inter-layer dielectric (ILD) layer, is formed over the substrate 101 and around the semiconductor fins 103 and the gate electrodes 109. Other electrically conductive features, such as interconnect structures comprising conductive lines 115 and vias 114, may also be formed in the one or more dielectric layers 117. The FinFETs in FIG. 1 may be formed by any suitable method known or used in the art, details are not repeated here. For ease of discussion herein, the substrate 101, the electrical components (e.g., FinFETs) formed in or on the substrate 101, the contacts 113, conductive features 115/114, and the one or more dielectric layers 117 are collectively referred to as substrate 50.

Still referring to FIG. 1, a dielectric layer 119, which may be an etch stop layer (ESL), is formed over the one or more dielectric layers 117. In an embodiment, the dielectric layer 119 is formed of silicon nitride using plasma-enhanced physical vapor deposition (PECVD), although other dielectric materials such as nitride, carbide, combinations thereof, or the like, and alternative techniques of forming the dielectric layer 119, such as low-pressure chemical vapor deposition (LPCVD), PVD, or the like, could alternatively be used. In some embodiments, the dielectric layer 119 is omitted. Next, a dielectric layer 121 is formed over the dielectric layer 119. The dielectric layer 121 may be any suitable dielectric material, such as silicon oxide, silicon nitride, or the like, formed by a suitable method, such as PVD, CVD, or the like. One or more memory device 123A, each of which includes a plurality of memory cells, are formed in the dielectric layer 121 and coupled to electrically conductive features (e.g., vias 124 and conductive lines 125) in the dielectric layer 121. Embodiments of the memory devices 123A or 123B in FIG. 1 (e.g., 3D memory device 200) are discussed hereinafter in details.

FIG. 1 further illustrates a second layer of memory devices 123B formed over the memory devices 123A. The memory devices 123A and 123B may have a same or similar structure, and may be collectively referred to as memory devices 123. The example of FIG. 1 illustrates two layers of memory devices 123 as a non-limiting example. Other numbers of layers of memory devices 123, such as one layer, three layers, or more, are also possible and are fully intended to be included within the scope of the present disclosure. The one or more layers of memory device 123 are formed in a memory region 130 of the semiconductor device 100, and may be formed in the back-end-of-line (BEOL) processing of semiconductor manufacturing. The memory devices 123 may be formed in the BEOL processing at any suitable locations within the semiconductor device 100, such as over (e.g., directly over) the first region 110, over the second region 120, or over a plurality of regions.

Still referring to FIG. 1, after the memory region 130 is formed, an interconnect structure 140, which includes dielectric layer 121 and electrically conductive features (e.g., vias 124 and conductive lines 125) in the dielectric layer 121, is formed over the memory region 130. The interconnect structure 140 may electrically connect the electrical components formed in/on the substrate 101 to form functional circuits. The interconnect structure 140 may also electrically couple the memory devices 123 to the components formed in/on the substrate 101, and/or couple the memory devices 123 to conductive pads formed over the interconnect structure 140 for connection with an external circuit or an external device. Formation of interconnect structure is known in the art, thus details are not repeated here.

In some embodiments, the memory devices 123 are electrically coupled to the electrical components (e.g., transistors) formed on the substrate 50, e.g., by the vias 124 and conductive lines 125, and are controlled or accessed (e.g., written to or read from) by functional circuits of the semiconductor device 100, in some embodiments. In addition, or alternatively, the memory devices 123 are electrically coupled to conductive pads formed over a top metal layer of the interconnect structure 140, in which case the memory devices 123 may be controlled or accessed by an external circuit (e.g., another semiconductor device) directly without involvement of the functional circuits of the semiconductor device 100, in some embodiments. Although additional metal layers (e.g., the interconnect structure 140) are formed over the memory devices 123 in the example of FIG. 1, the memory devices 123 may be formed in a top (e.g., topmost) metal layer of the semiconductor device 100, these and other variations are fully intended to be included within the scope of the present disclosure.

Figure 2:
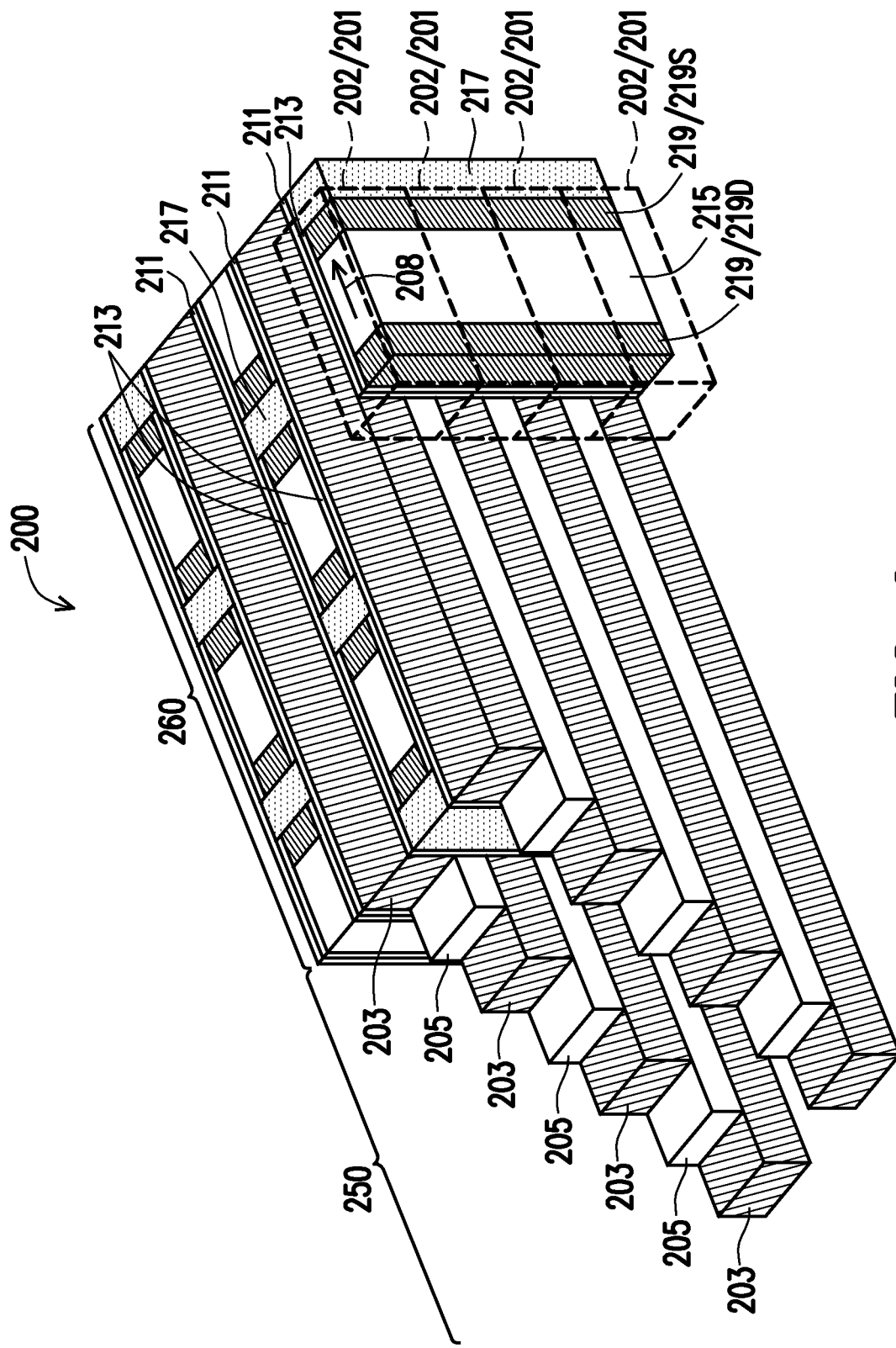
FIG. 2 illustrates a perspective view of a portion of a memory device, in an embodiment.

FIG. 2 illustrates a perspective view of a portion of a three-dimensional (3D) memory device 200, in an embodiment. The 3D memory device 200 of FIG. 2 may be used as the memory device 123A or 123B of FIG. 1. For ease of discussion, a 3D memory device may be referred to as a memory device in the discussion herein. The memory device 200 is a three-dimensional memory device with a ferroelectric material, in some embodiments. Note that for simplicity, not all features of the 3D memory device 200 are illustrated in the figure.

As illustrated in FIG. 2, the memory device 200 includes a plurality of memory cells 202, which may be arranged in a grid of rows and column in a same horizontal plane (e.g., a plane parallel to a major upper surface of the substrate 50). The memory cells 202 may further be stacked vertically to form a three dimensional memory array, thereby increasing the integration density of memory cells.

In some embodiments, the memory device 200 is a non-volatile memory device, such as a NOR memory device, or the like. Each memory cell 202 of the memory device 200 may include a transistor 201 (e.g. thin film transistor (TFT)) with an insulating, memory film 211 (e.g., a ferroelectric film) as a gate dielectric. In some embodiments, a gate of each transistor 201 is electrically coupled to, and/or include, a portion of a respective word line 203 (e.g., an electrically conductive line 203), a first source/drain region of each transistor 201 is electrically coupled to, and/or include, a portion of a respective bit line (BL) 219D (e.g., an electrically conductive line 219D), and a second source/drain region of each transistor 201 is electrically coupled to, and/or include, a portion of a respective source line (SL) 219S (e.g., an electrically conductive line 219S). The memory cells 202 in a same horizontal row of the memory device 200 may share a common word line 203 while the memory cells 202 in a same vertical column of the memory device 200 may share a common source line 219S and a common bit line 219D. The bits lines 219D and the source lines 219S may be collectively referred to as the source/drain regions 219 of the transistor 201.

The memory device 200 includes a plurality of word lines (WL) 203 interleaved with a plurality of dielectric layers 205. In other words, the memory device 200 includes alternating layers of WLs 203 and the dielectric layers 205. The WLs 203 extend in a direction parallel to a major surface of an underlying substrate 50 (not illustrated in FIG. 2, see FIG. 1). The memory device 200 may have a staircase shaped region 250 and a memory array region 260. In the staircase shaped region 250, the WLs 203 and the dielectric layers 205 may have staircase shaped configurations such that lower WLs 203 are longer than and extend laterally past endpoints of upper WLs 203. For example, in FIG. 2, multiple, stacked layers of WLs 203 are illustrated with the topmost WL 203 being the shortest and the bottommost WL 203 being the longest. Respective lengths of the WLs 203 may increase in a direction towards the underlying substrate. In this manner, a portion of each of the WLs 203 in the staircase shaped region 250 may be easily accessible from above the memory device 200, and conductive contacts may be formed over and electrically coupled to the exposed portion of each of the WLs 203. Memory cells 202 are formed in the memory array regions 260.

The memory device 200 further includes a plurality of bit lines (BLs) 219D and source lines (SLs) 219S. The BLs 219D and SLs 219S may extend in a direction perpendicular to the WLs 203. A dielectric material 215 is disposed between and isolates adjacent ones of the BLs 219D and the SLs 219S.

Pairs of the BLs 219D and SLs 219S along with an intersecting WL 203 define boundaries of each memory cell 202, and a dielectric material 217 is disposed between and isolates adjacent memory cells 202. Therefore, the dielectric material 217 may also be referred to as memory cell isolation regions or dielectric plugs. In some embodiments, the SLs 219S are electrically coupled to electrical ground. Although FIG. 2 illustrates a particular placement of the BLs 219D relative to the SLs 219S, it should be appreciated that the placement of the BLs 219D and SLs 219S may be flipped in other embodiments.

As illustrated in FIG. 2, the memory device 200 may also include a channel material 213, such as an oxide semiconductor (OS) layer. The channel material 213 may be referred to as an OS layer 213 herein, with the understanding that any suitable channel material may be used as the channel material 213. The channel material 213 may provide channel regions for the transistor 201 of the memory cells 202. For example, when an appropriate voltage (e.g., a voltage higher than a respective threshold voltage ($V_{th}$) of a corresponding transistor 201) is applied through a corresponding WL 203, a region of the OS layer 213 in the transistor 201 may allow current to flow from the BL 219D to the SL 219S (e.g., in the direction indicated by arrow 208).

A memory film 211 is disposed between the BL 219D/SL 219S and the OS layer 213, and the memory film 211 may function as gate dielectrics for the transistors 201. In some embodiments, the memory film 211 comprises a ferroelectric material, such as a hafnium oxide, hafnium zirconium oxide, silicon-doped hafnium oxide, or the like. Accordingly, the memory film 211 may also be referred to as a ferroelectric film 211, and the memory device 200 may also be referred to as a ferroelectric random access memory (FeRAM) device 200, or a 3D FeRAM device 200. Alternatively, the memory film 211 may be a multilayer structure comprising a layer of $SiN_x$ between two $SiO_x$ layers (referred to as an ONO structure), a different ferroelectric material, a different type of memory layer (e.g., capable of storing a bit), or the like.

In some embodiments where the memory film 211 comprises a ferroelectric material, the memory film 211 may be polarized in one of two different directions, and the electrical polarization direction of the memory film 211 may be changed by applying an appropriate voltage differential across the memory film 211 and generating an appropriate electric field. The polarization may be relatively localized (e.g., generally contained within each boundaries of the memory cells 202), and a continuous region of the memory film 211 may extend across a plurality of memory cells 202. Depending on an electrical polarization direction of a particular region of the memory film 211, a threshold voltage of a corresponding transistor 201 varies, and a digital value (e.g., 0 or 1) can be stored. For example, when a region of the memory film 211 has a first electrical polarization direction, the corresponding transistor 201 may have a relatively low threshold voltage, and when the region of the memory film 211 has a second electrical polarization direction, the corresponding transistor 201 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the memory film 211 corresponding to the memory cell 202. The write voltage can be applied, for example, by applying a first voltages to a corresponding WL 203, and applying a second voltage to the corresponding BL 219D and SL 219S, where the difference between the first voltage and the second voltage is equal to the write voltage. By applying the write voltage across the portion of the memory film 211, a polarization direction of the region of the memory film 211 can be changed. As a result, the corresponding threshold voltage of the corresponding transistor 201 can be switched from a low threshold voltage to a high threshold voltage, or vice versa, and the threshold voltage of the transistor 201 is used to indicate a digital value (e.g., 0 or 1) stored in the memory cell 202.

To perform a read operation on the memory cell 202 in such embodiments, a read voltage (a voltage between the low and high threshold voltages) is applied to the WL 203 of a memory cell 202. Depending on the polarization direction of the corresponding region of the memory film 211, the transistor 201 of the memory cell 202 may or may not be turned on. As a result, when a voltage is applied across the BL 219D and SL 219S, there may or may not be an electrical current (see, e.g., 208 in FIG. 2) flowing between the BL 219D and SL 219S, which electrical current may be detected to determine the digital value stored in the memory cell 202.

FIGS. 3-8, 9A, 9B, and 10A-10J illustrate various views (e.g., perspective view, cross-sectional view) of a three-dimensional (3D) memory device 200 at various stages of manufacturing, in an embodiment. The processing of FIGS.

3-8, 9A, 9B, and 10A-10J are performed to form the 3D memory device 200 of FIG. 2, in accordance with an embodiment.

Figure 3:
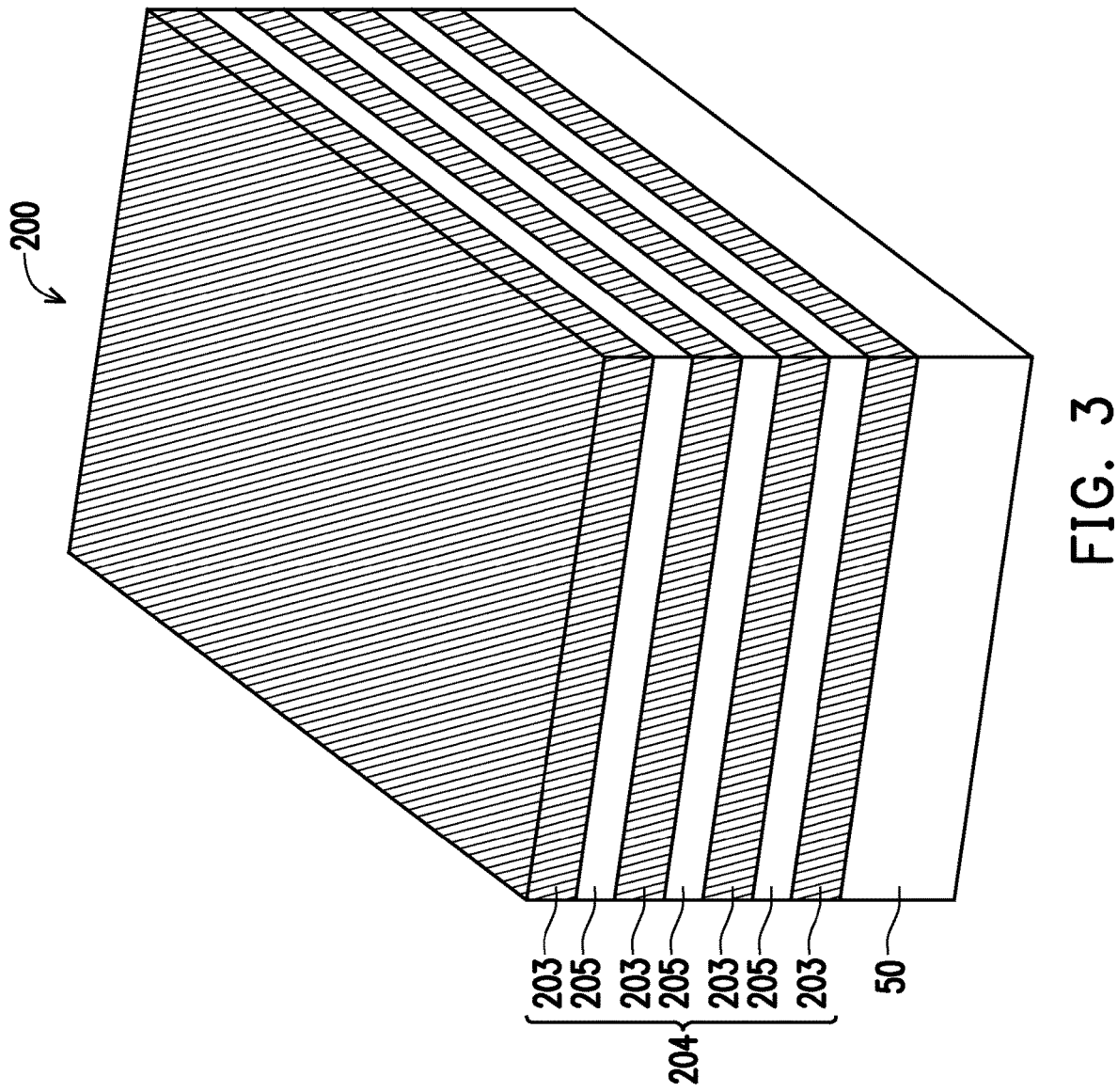

Referring to FIG. 3, a layer stack 204 (may also be referred to as a multilayer stack) is formed over the substrate 50. Note that the substrate 50 is illustrated in FIG. 3 to show the location of the 3D memory device 200 relative to the substrate 50, and the substrate 50 may not be considered part of the 3D memory device 200. In addition, not all features of the 3D memory device 200 are illustrated. For example, the dielectric layer 119 (see FIG. 1) over the substrate 50 is not illustrated in FIG. 3. For simplicity, the substrate 50 is not illustrated in subsequent figures.

In some embodiments, the layer stack 204 includes alternating conductive layers 203 (e.g., electrically conductive) and dielectric layers 205. The conductive layers 203 are patterned in subsequent steps to form WLs 203 (see, e.g., FIG. 2). The conductive layers 203 may comprise an electrically conductive material, such as, copper, titanium, titanium nitride, tantalum, tantalum nitride, tungsten, ruthenium, molybdenum, aluminum, combinations thereof, or the like, and the dielectric layers 205 may comprise an insulating material, such as silicon oxide, silicon nitride, silicon oxynitride, combinations thereof, or the like. The conductive layers 203 and the dielectric layers 205 may be each formed using, for example, chemical vapor deposition (CVD), atomic layer deposition (ALD), physical vapor deposition (PVD), plasma enhanced CVD (PECVD), or the like. Although FIG. 3 illustrates a particular number of conductive layers 203 and dielectric layers 205, other embodiments may include a different number of conductive layers 203 and dielectric layers 205.

Figure 4:
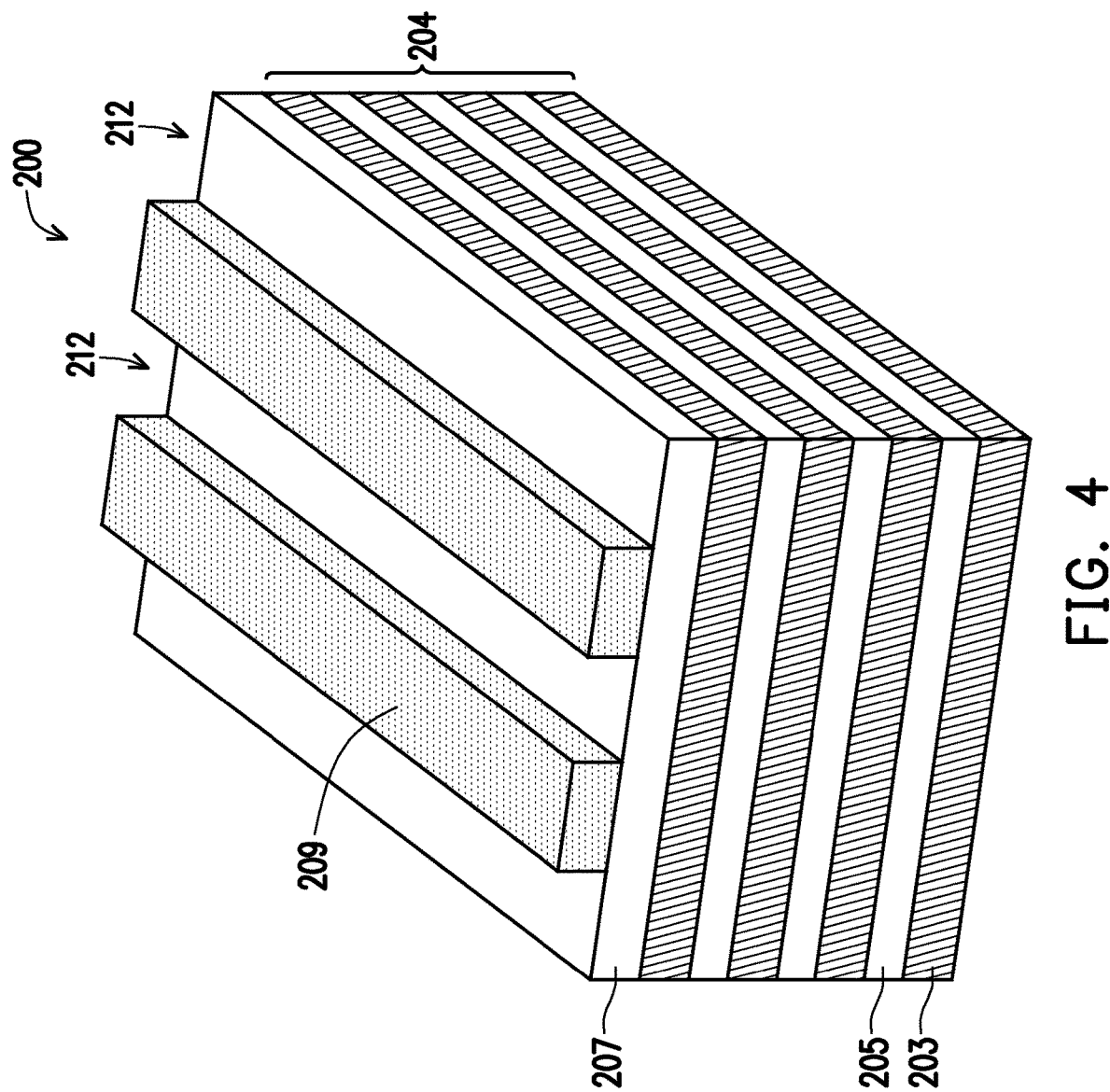

Next, in FIG. 4, a hard mask layer 207 is formed over the layer stack 204, and a photoresist 209 is formed over the hard mask layer 207. The hard mask layer 207 may include, for example, silicon nitride, silicon oxynitride, or the like, which may be deposited by CVD, PVD, ALD, PECVD, or the like. The photoresist 209 may be formed by using a spin-on technique, for example.

Next, the photoresist 209 is patterned using acceptable photolithography and etching techniques. For example, the photoresist 209 may be exposed to light for patterning. After the exposure process, the photoresist 209 may be developed to remove exposed or unexposed portions of the photoresist depending on whether a negative or positive photoresist is used, thereby forming a patterned photoresist 209 with trenches 212, where locations of the trenches 212 correspond to locations of trenches 206 (see FIG. 5) formed in the layer stack 204.

Figure 5:
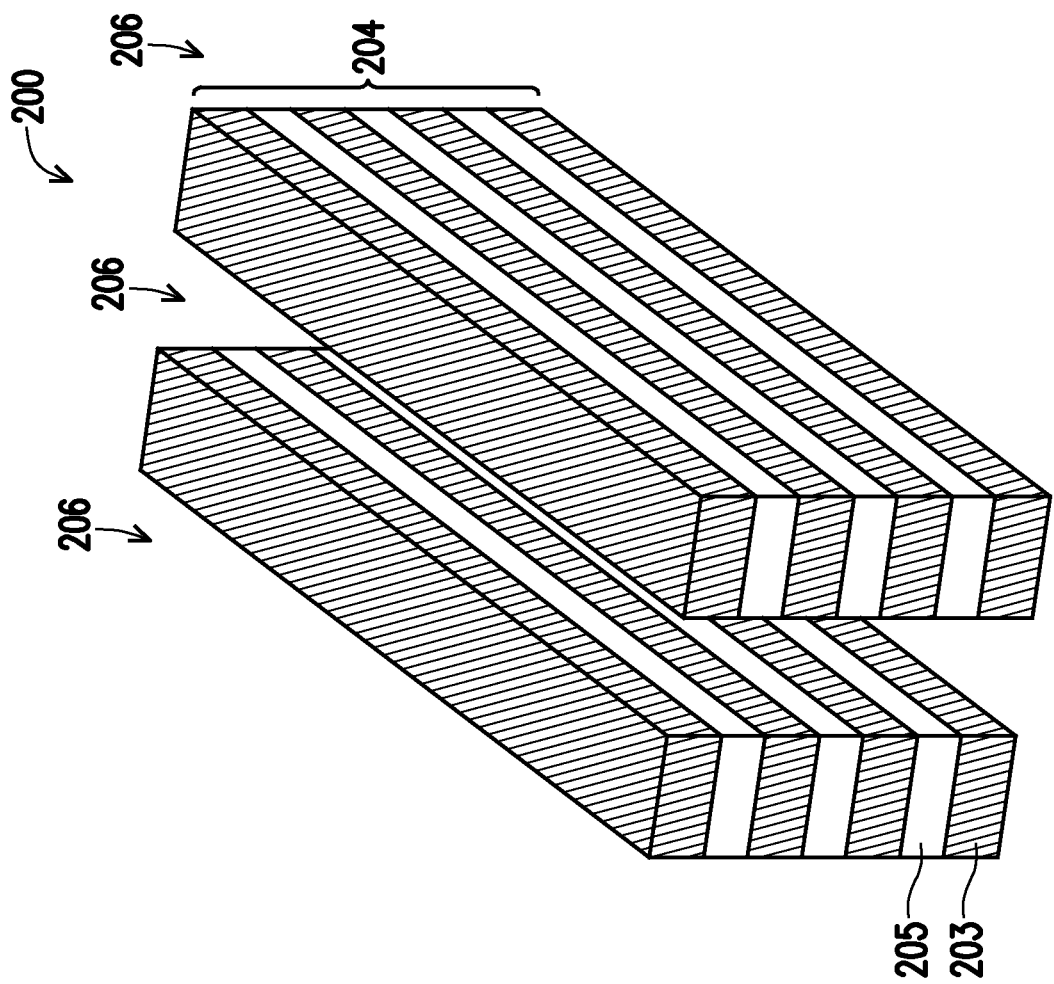

Next, in FIG. 5, the pattern of the patterned photoresist 209 is transferred to the hard mask layer 207 using an acceptable etching process, such as wet etching, dry etching, a reactive ion etch (RIE), neutral beam etch (NBE), the like, or a combination thereof. The etching may be anisotropic. The patterned photoresist 209 may then be removed, e.g., by an ashing process.

Next, the pattern of the hard mask layer 207 is transferred to the layer stack 204 using one or more acceptable etching processes, such as wet etching, dry etching, RIE, NBE, the like, or a combination thereof. The etching processes may be anisotropic. After the etching process, trenches 206 are formed that extend through the layer stack 204. The trenches 206 separate the layer stack 204 into a plurality of separate, fin-shaped structures, as illustrated in FIG. 5. The hard mask layer 207 is removed after the trenches 206 are formed using a suitable removal process. In some embodiments, the hard mask layer 207 is removed after the trenches 206 are filled (e.g., with ferroelectric material 211, channel material 213, and dielectric material 215) using, e.g., a planarization process such as chemical mechanical planarization (CMP).

Figure 6:
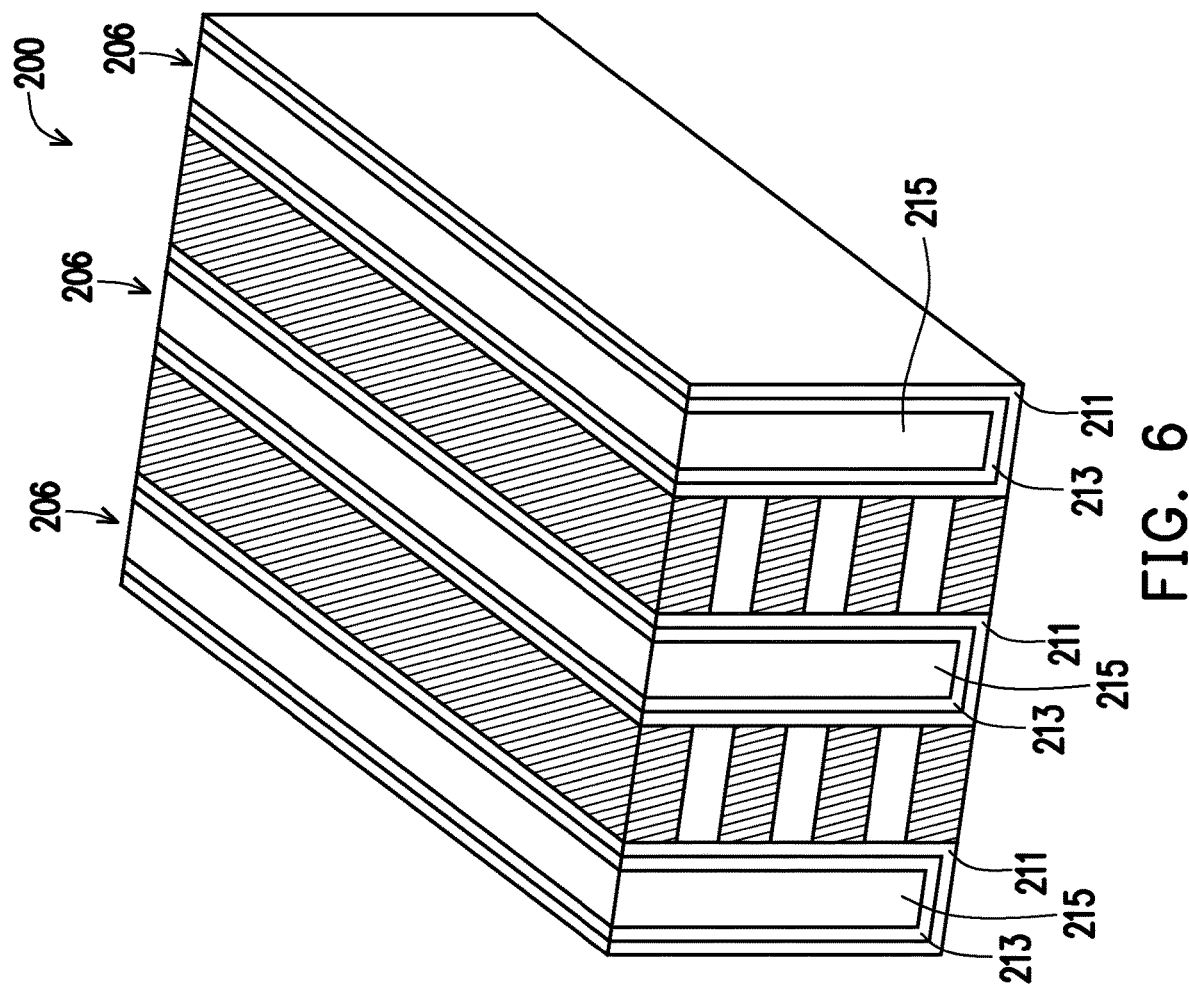

Next, in FIG. 6, a memory film 211 is formed (e.g., conformally) to line sidewalls and bottoms of the trenches 206, a channel material 213 is formed (e.g., conformally) over the memory film 211, and a dielectric material 215 is formed over the channel material 213 to fill the trenches 206.

In some embodiments, the memory film 211 is formed of a ferroelectric material, such as hafnium zirconium oxide (HfZrO); zirconium oxide (ZrO); hafnium oxide (HfO) doped with lanthanum (La), silicon (Si), aluminum (Al), or the like; undoped hafnium oxide (HfO); or the like. In some embodiments, the memory film 211 has a multilayer structure comprising a silicon nitride layer between two silicon oxide layers (referred to as an ONO structure). The memory film 211 may be referred to as a ferroelectric film 211 or a ferroelectric material 211 in the discussion herein, with the understanding that any suitable memory material (e.g., capable of storing a bit) may be used as the memory film 211. The material of the memory film 211 may be formed by a suitable deposition process such as ALD, CVD, PVD, PECVD, or the like.

As illustrated in FIG. 6, the channel material 213 is formed (e.g., conformally) in the trenches 206 over the ferroelectric film 211. The channel material 213 is formed of a suitable semiconductor material for providing channel regions for the transistors 201 of the memory cells 202, such as polysilicon, amorphous silicon, or an oxide semiconductor (OS) material such as indium gallium zinc oxide (IGZO), indium tin oxide (ITO), indium gallium zinc tin oxide (IGZTO), zinc oxide (ZnO), indium tungsten oxide (IWO), or the like. The channel material 213 may be formed by an acceptable deposition process such as ALD, CVD, PVD, PECVD, or the like.

Next, the dielectric material 215 is formed in the trenches 206 to fill the trenches 206. Suitable dielectric materials include oxides such as silicon oxide; nitrides such as silicon nitride; carbides such as silicon carbide; the like; or combinations thereof such as silicon oxynitride, silicon oxycarbide, silicon carbonitride, or the like. The dielectric material 215 may be formed by an acceptable deposition process such as ALD, CVD, PVD, PECVD, or the like. A planarization process, such as CMP, may be performed next to remove excess portions of the ferroelectric film 211, the channel material 213, and the dielectric material 215 from the top surface of the layer stack 204. The planarization process may also remove the hard mask layer 207 from the top surface of the layer stack 204, as discussed above.

Figure 7:
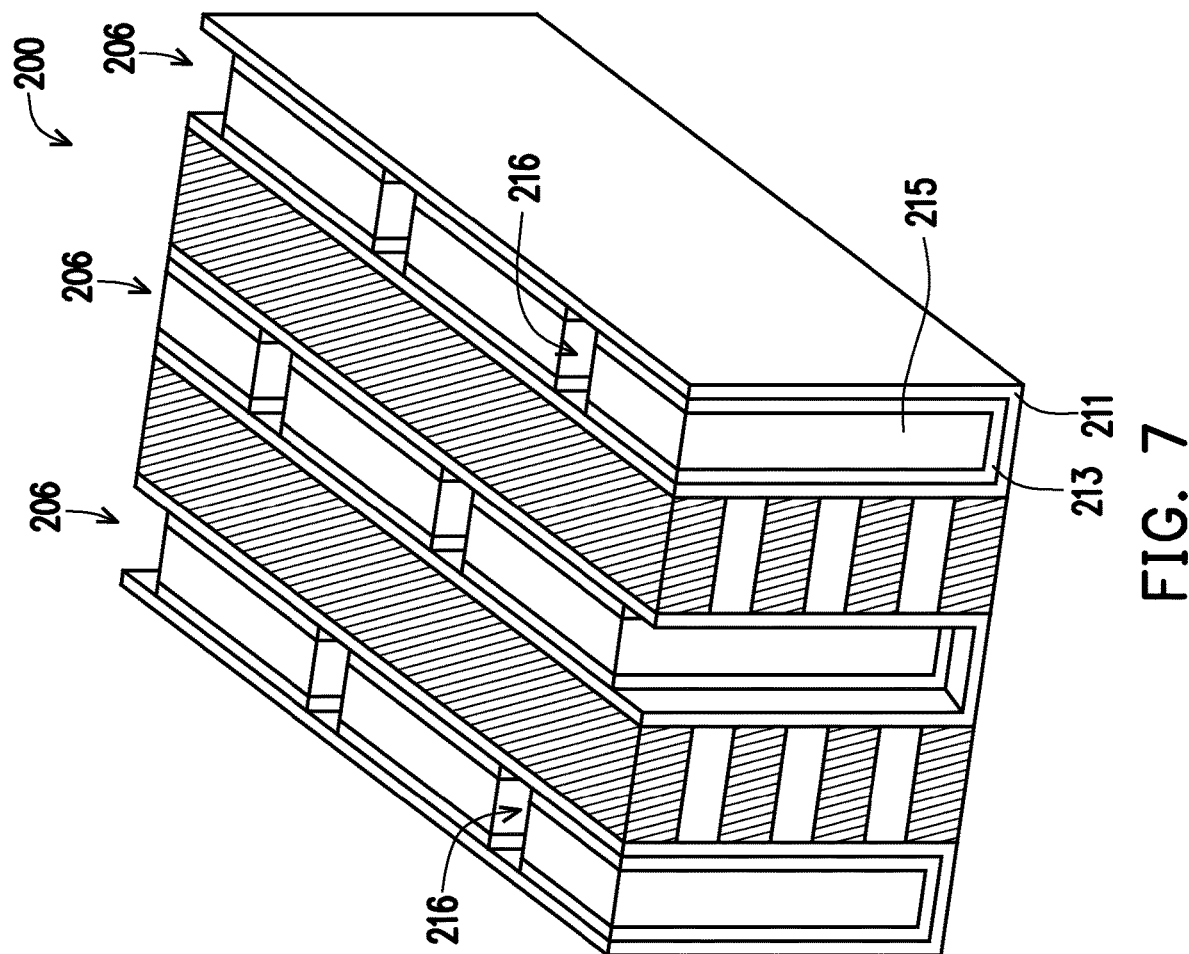

Next, in FIG. 7, openings 216 are formed in the trenches 206 by removing portions of the channel material 213 and portions of the dielectric material 215. Each of the openings 216 in a respective trench 206 extends horizontally between opposing inner sidewalls of the ferroelectric film 211 facing the respective trench 206, and extends vertically from the upper surface of the layer stack 204 to an upper surface of the ferroelectric film 211 at the bottom of the trench 206. In other words, each opening 216 exposes inner sidewalls of the ferroelectric film 211 facing a respective trench 206. In addition, each opening 216 exposes an upper surface of the ferroelectric film 211 under (e.g., under and physically contacting) the dielectric material 215, and does not extend through the ferroelectric film 211, in the illustrated embodiment. The openings 216 may be formed by an anisotropic etching process using a patterned mask layer having patterns (e.g., openings) at locations corresponding to the locations of the openings 216, as an example.

Figure 8:
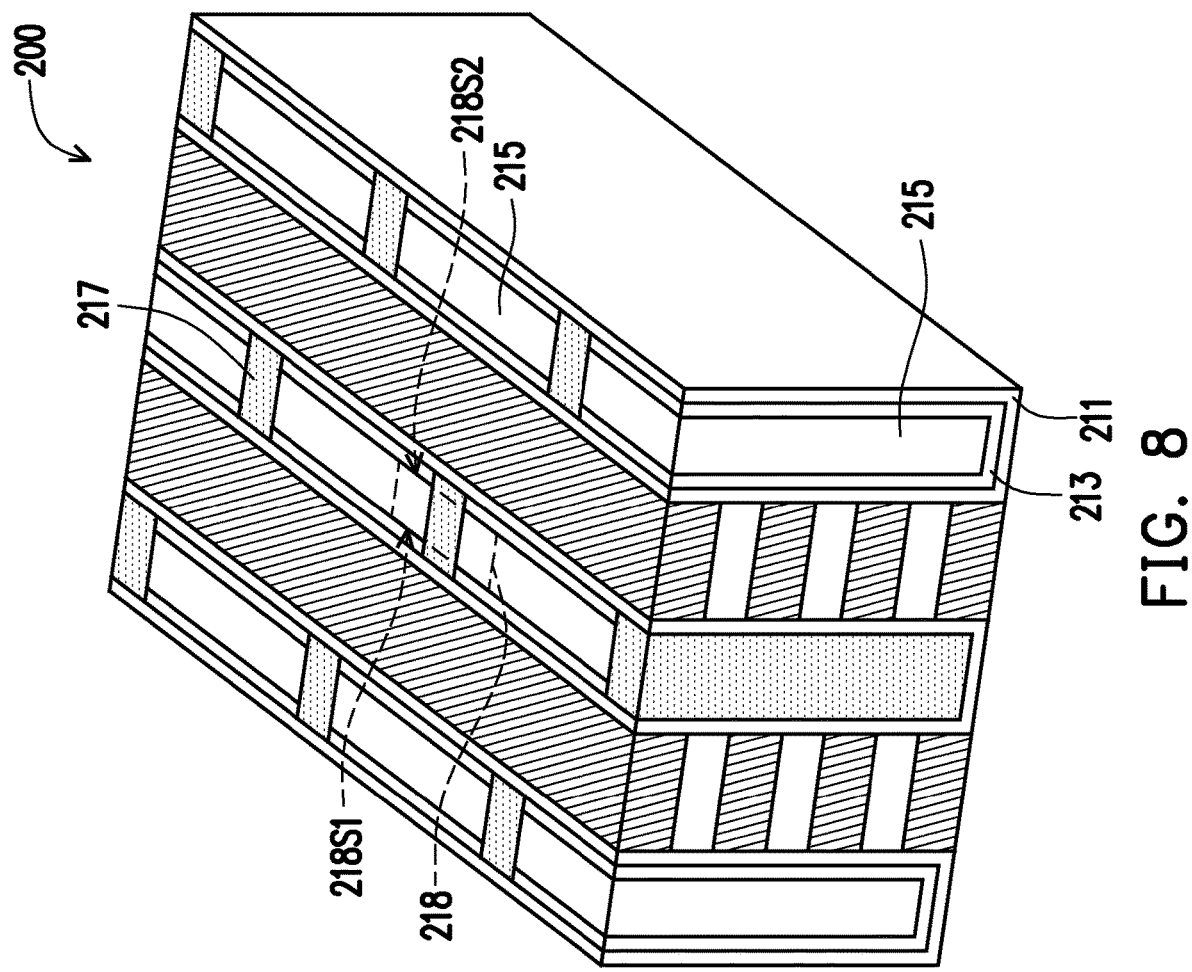

Next, in FIG. 8, a dielectric material is formed in the openings 216 to form isolation regions 217. The dielectric material for forming the isolation regions 217 may be any suitable dielectric material, such as silicon nitride, silicon oxide, silicon oxynitride, the like, or combinations thereof, and may be formed by PVD, CVD, ALD, PECVD, or the like. In some embodiments, the dielectric material for forming the isolation regions 217 is different from the dielectric material 215 to provide etching selectivity in subsequent processing. A planarization process, such as CMP, may be performed to remove excess portions of the dielectric material from the upper surface of the layer stack 204. As will be discussed in more detail hereinafter, the isolation regions 217 electrically isolate laterally adjacent memory cells 202 in a same trench, and therefore, may also be referred as memory cell isolation regions, or dielectric plugs.

Figure 9A:
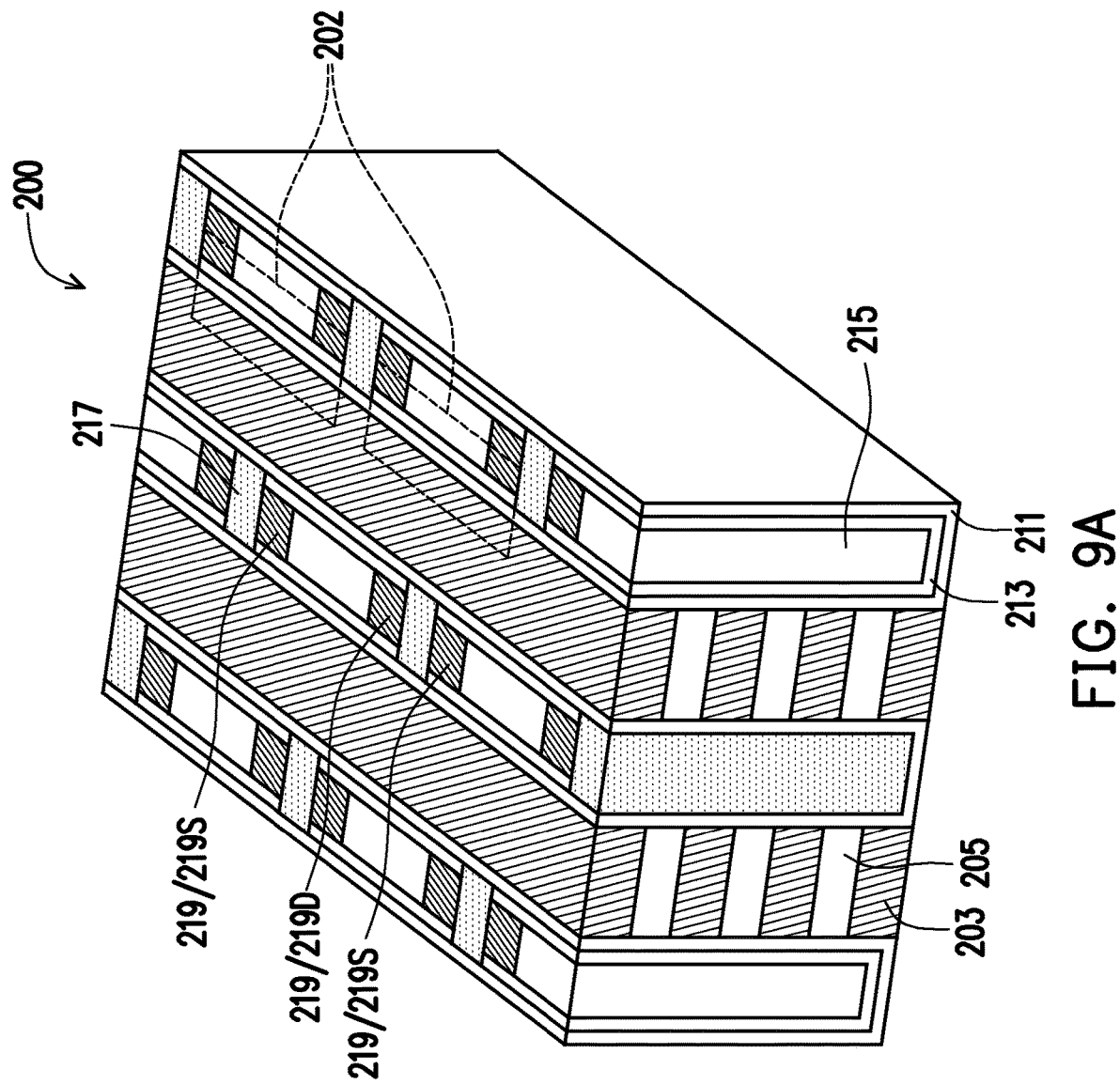

Next, in FIG. 9A, bit lines (BLs) 219D and source lines (SLs) 219S are formed in the dielectric material 215 on opposing sides of isolation regions 217. In some embodiments, to form the BLs 219D and SLs 219S, a patterned mask layer is formed over the structure of FIG. 8, where the patterns (e.g., openings) of the patterned mask layer expose areas 218 (see FIG. 8), where each of the areas 218 includes a portion of the isolation region 217 and portions of the dielectric material 215 on opposing sides of the isolation region 217. To avoid clutter, FIG. 8 only shows one of the areas 218. Note that two opposing sides 218S1 and 218S2 of the area 218 are aligned (e.g., overlap) with two respective inner sidewalls of the channel material 213.

Still referring to FIG. 9A, next, an anisotropic etching process is performed to selectively remove portions of the dielectric material 215 exposed by the patterned mask layer (e.g. within areas 218) using, for example, an etchant selective to (e.g., having a higher etch rate for) the dielectric material 215. The openings formed by the selective etching may extend vertically through the layer stack 204, such that the SLs 219S and the BLs 219D formed in the openings extend through the layer stack 204. Next, an electrically conductive material, such as copper, titanium, titanium nitride, tantalum, tantalum nitride, tungsten, ruthenium, molybdenum, aluminum, combinations thereof, or multiple layers thereof, are formed to fill the openings using a suitable formation method, such as PVD, CVD, ALD, PECVD, or the like. A planarization process, such as CMP, may be performed next to remove excess portions of the electrically conductive material from the upper surface of the layer stack 204, and remaining portions of the electrically conductive material in the openings form the SLs 219S and BLs 219D.

The dashed boxes in FIG. 9A illustrate some of the memory cells 202 of the memory device 200. Note that to avoid clutter, not all memory cells 202 of the memory device 200 are marked by dashed boxes. Each memory cell 202 includes portions of the following structures/layers/materials within its boundaries: a WL 203, a bit line 219D, a source line 219S, the memory film 211 (e.g., a ferroelectric film), the channel material 213, and the dielectric material 215. As discussed previously, the WL 203 of a memory cell 202 functions as the gate (also referred to as a gate electrode) of the transistor 201 of the memory cell 202, and the SL 219S/BL 219D function as the source/drain regions of the transistor 201. As illustrated in FIG. 9A, each isolation region 217 isolates two laterally adjacent memory cells 202 formed in a same trench.

Figure 9B:
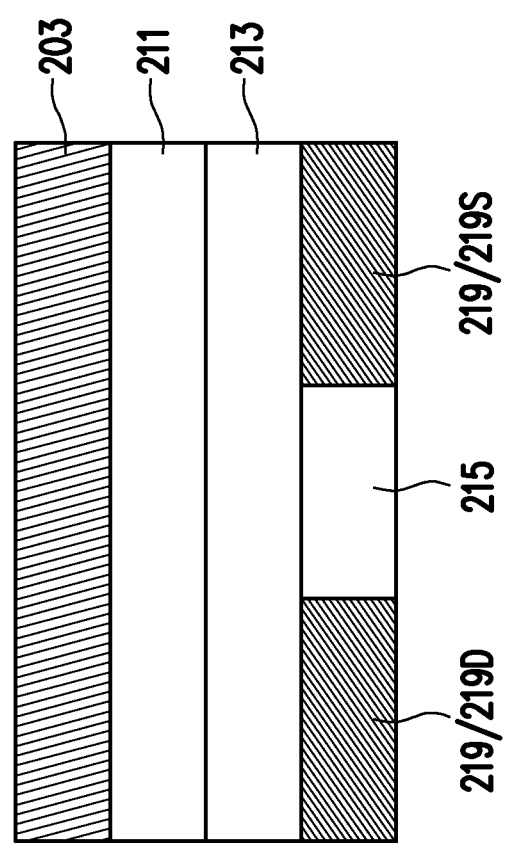

FIG. 9B illustrates a top view of a memory cell 202 in FIG. 9A. As illustrated in FIG. 9B, the memory film 211 is disposed between, and contacts, the WL 203 and the channel material 213. The SL 219S and BL 219D are in contact with (e.g., physically contacts) the channel material 213. The dielectric material 215 is disposed laterally between the SL 219S and BL 219D.

In some embodiments, the channel material 213 is or comprises indium zinc compound oxide ($In_xZn_yM_zO$), wherein x, y, and z are values between zero and one (0≤x, y, z≤1), and M stands for a suitable material such as Ti, Ta, Al, Ga, Mg, or Si. Therefore, indium zinc compound oxide may refer to a plurality of different materials, when the element M in $In_xZn_yM_zO$ is replaced by, e.g., Ti, Ta, Al, Ga, Mg, or Si. In embodiments where the element M in indium zinc compound oxide ($In_xZn_yM_zO$) is a metal, such as Ti, Ta, Al, Ga, or Mg, indium zinc compound oxide may also be referred to as indium zinc metal oxide. In the discussion herein, indium zinc compound oxide may be used interchangeably with indium zinc metal oxide. In the illustrated embodiment, the as-deposited channel material 213 is an amorphous material (e.g., an amorphous indium zinc metal oxide material).

Next, in FIG. 10A, a thermal treatment 220 (may also be referred to as a thermal process) is performed to form a crystalline material 223, such as a crystalline indium zinc metal oxide material, between the BL 219D/SL 219S and the ferroelectric film 211 in each of the memory cells 202. The thermal process 220 may be performed at a temperature between about 300° C. and about 400° C., for a duration less than about 48 hours, such as for a duration of about 1 hour, as an example.

Figure 10B:
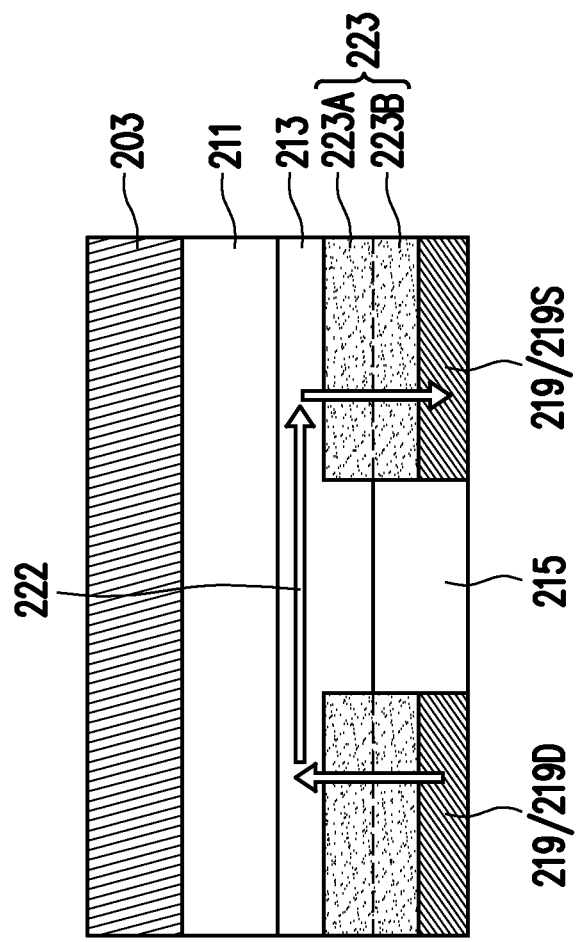

FIG. 10B illustrates the memory cell 202 of FIG. 9A after the thermal treatment 220, in an embodiment. In the illustrated embodiment, the SL 219S/BL 219D is a metal material denoted by $\tilde{M}$ to distinguish from the element M in the channel material 213, which channel material 213 is amorphous indium zinc compound oxide ($In_xZn_yM_zO$) before the thermal treatment 220. The metal material $\tilde{M}$ of SL 219S/BL 219D may be, e.g., W, Ti, or Ta. During the thermal treatment 220, the metal material $\tilde{M}$ of SL 219S/BL 219D diffuses into the channel material 213 to induce crystallization of the channel material 213, thereby converting first portions of the channel material 213 (e.g., portions contacting SL 219S/BL 219D) into a crystalline material 223A, such as crystalline indium zinc compound oxide (e.g., crystalline indium zinc metal oxide). Therefore, the thermal treatment 220 is said to crystallize the first portions of the channel material 213, and the crystalline material 223A may also be referred to as crystallized first portions 223A of the channel material 213.

In addition, the metal material $\tilde{M}$ reacts with the channel material 213 to form a metal oxide $\tilde{M}O$ (e.g., tungsten oxide, titanium oxide, or tantalum oxide). In some embodiments, a chemical reaction between the metal material $\tilde{M}$ and the channel material 213 is described by the following chemical equation:

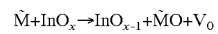

$$\tilde{M} + InO_x \rightarrow InO_{x-1} + \tilde{M}O + V_0$$

where the material $InO_x$ comes from the indium zinc compound oxide of the channel material 213, which is composed of $InO_x$, ZnO and MO, in some embodiments. As indicated by the above chemical equation, the $InO_x$ loses an oxygen atom to produce $InO_{x-1}$ and an oxygen vacancy $V_0$, and the oxygen atom lost by $InO_x$ combines with the metal material $\tilde{M}$ to form the metal oxide $\tilde{M}O$. Therefore, after the thermal treatment 220, the crystallized first portions 223A of the channel material 213 also includes metal oxide $\tilde{M}O$. In some embodiments, the reduction of $InO_x$ in the channel material 213 contributes to higher conductivity of the crystallized portions of the channel material 213, and contributes to higher carrier generation. In some embodiments, a carrier concentration in the crystallized portions (e.g., 223A or 223B) of the channel material 213 is over 10E18/cm$^3$.

Still referring to FIG. 10B, during the thermal treatment 220, the channel material 213 also diffuses into the SL 219S/BL 219D and is induced by the metal material $\tilde{M}$ to be crystallized, thereby forming a crystalline material 223B in regions of the SL 219S/BL 219D adjacent to the channel material 213. In addition, the metal material $\tilde{M}$ in the SL 219S/BL 219D reacts with the diffused channel material 213 (e.g., InO$_x$) to form the metal oxide $\tilde{M}O$ in the crystalline material 223B, similar to the discussion above regarding the crystalline material 223A. Therefore, the crystalline materials 223A and 223B have a same or similar chemical composition (e.g., comprising crystalline indium zinc metal oxide and the metal oxide $\tilde{M}O$), and may be referred to collectively as a crystalline material 223, in some embodiments.

As illustrated in FIG. 10B, the crystalline material 223 includes first regions (e.g., 223A) in the channel material 213 and second regions (e.g., 223B) in the SL 219S/BL 219D. Concentration of the metal oxide $\tilde{M}O$ (or the crystalline indium zinc metal oxide), however, may show a gradient in the crystalline material 223, due to the diffusion of the metal material $\tilde{M}$ (or the channel material 213). In some embodiments, the concentration of the metal oxide $\tilde{M}O$ in the crystalline material 223 decreases along a first direction from the SL 219S/BL 219D toward the channel material 213 (e.g., from a region 223B toward a respective region 223A). In addition, the concentration of crystalline indium zinc metal oxide in the crystalline material 223 decreases along a second direction from the channel material 213 toward the SL 219S/BL 219D (e.g., from a region 223A toward a respective region 223B). In other words, the gradients of the concentrations of the metal oxide $\tilde{M}O$ and the crystalline indium zinc metal oxide change along opposite directions, in some embodiments.

In FIG. 10B, second portions of the channel material 213 disposed laterally between the SL 219S and the BL 219D remain an amorphous material (e.g., amorphous indium zinc metal oxide), because the metal material $\tilde{M}$ in the SL 219S/BL 219D did not diffuse into (e.g., reach) those regions. In the example of FIG. 10B, third portions of the channel material 213, which are disposed between the ferroelectric film 211 and the crystallized first portions 223A of the channel material 213, also remain an amorphous material (e.g., amorphous indium zinc metal oxide), due to the metal material $\tilde{M}$ not diffusing into those regions.

Figure 10C:
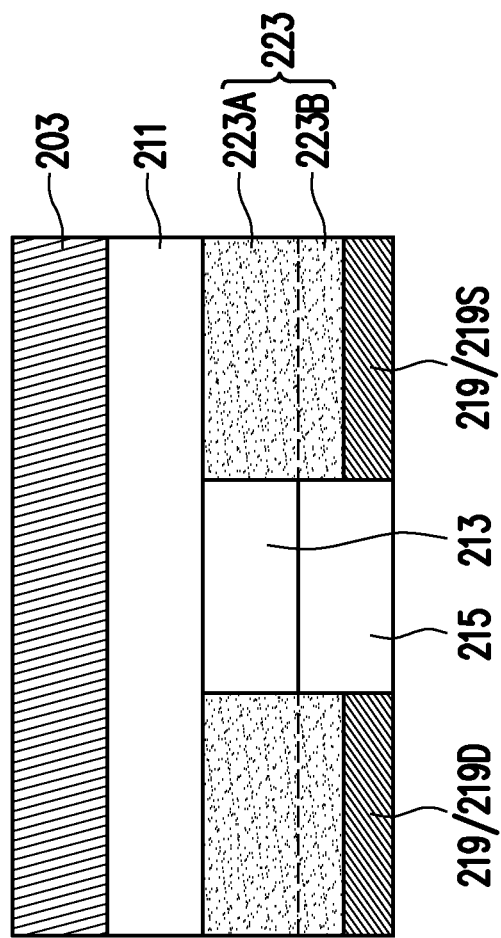
Figure 10D:
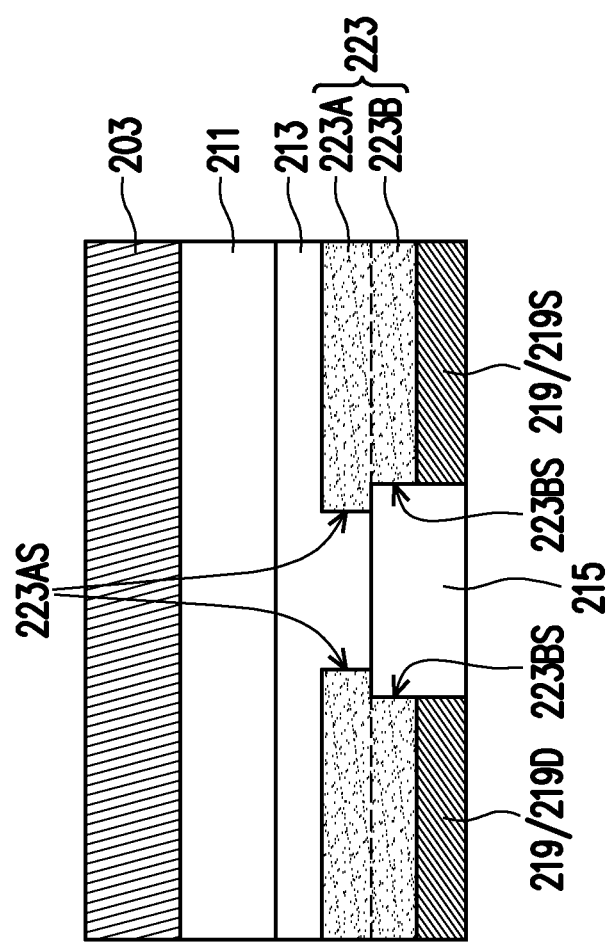
Figure 10E:
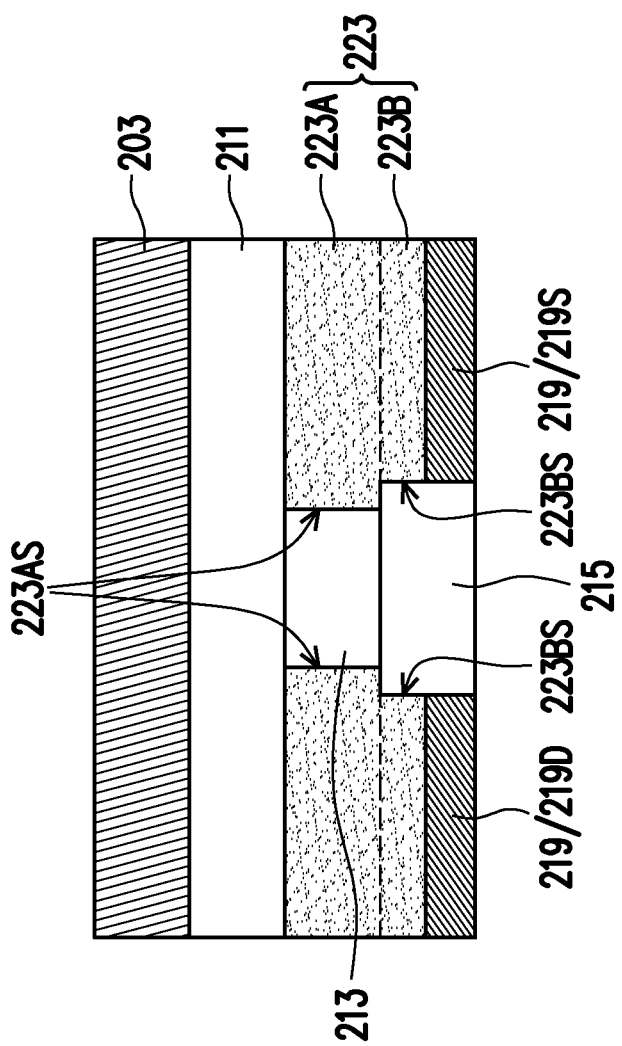
Figure 10F:
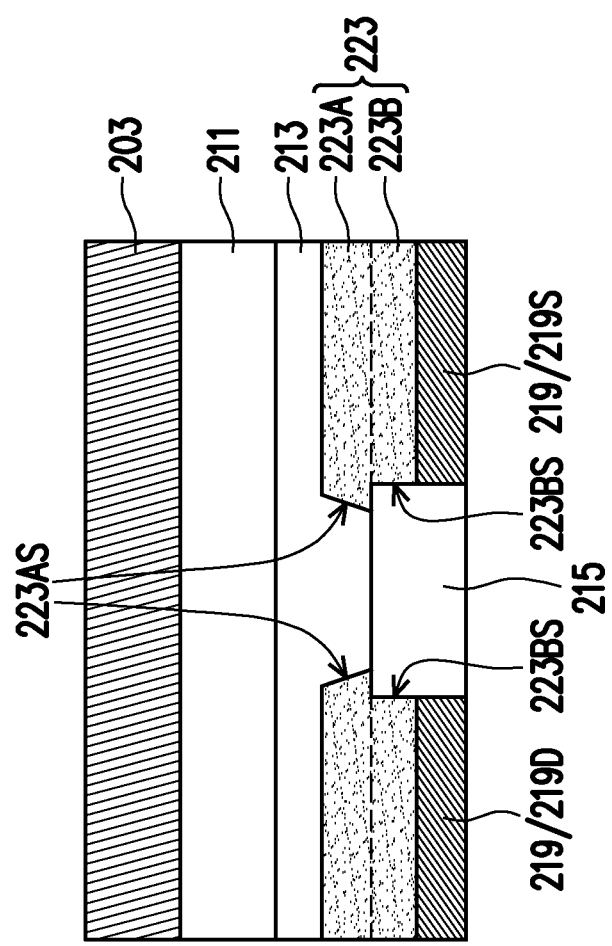
Figure 10G:
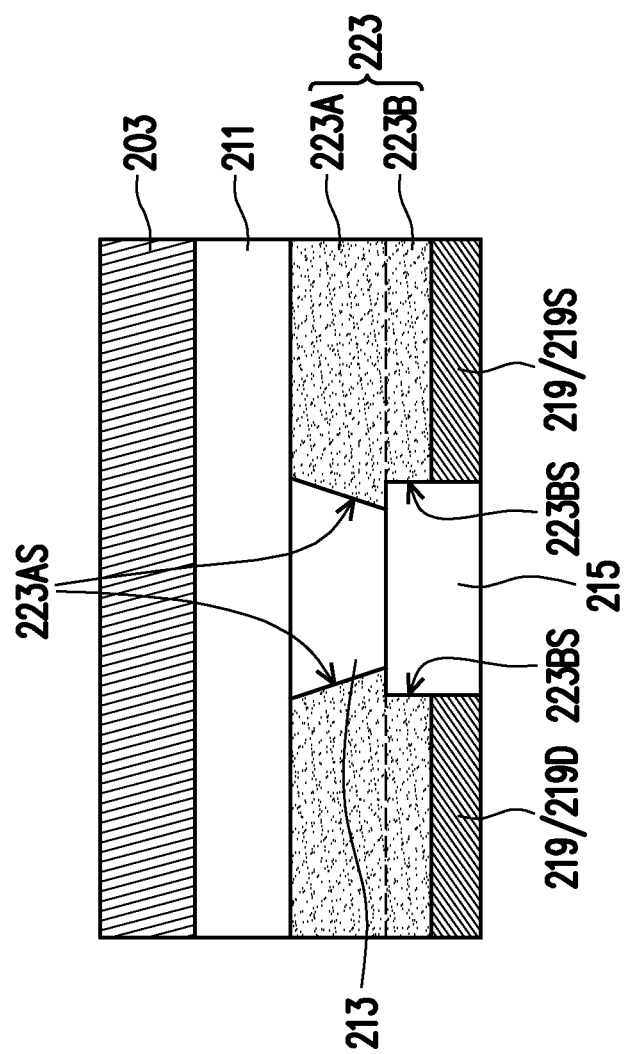

The shape and dimension of the crystalline material 223 in FIG. 10B is a non-limiting example. Other shapes and/or dimensions are also possible and are fully intended to be included within the scope of the present disclosure. Additional examples of the shape and dimension of the crystalline material 223 are illustrated in FIGS. 10C-10G. For example, depending on factors such as the thickness of the channel material 213, or duration/temperature of the thermal treatment 220, the crystallized first portions 223A of the channel material 213 may extend to (e.g., physically contact) the ferroelectric film 211, as illustrated in FIG. 10C. In FIGS. 10B and 10C, the diffusion of the metal $\tilde{M}$ occurs along the vertical direction. In some embodiments, such as illustrated in FIGS. 10D-10G, lateral diffusion of the metal $\tilde{M}$ also occurs in the channel material 213, and as a result, the first regions 223A of the crystalline material 223 are wider than the second regions 223B of the crystalline material 223, such that a distance between opposing sidewalls 223AS of the first regions 223A is smaller than a distance between opposing sidewalls 223BS of the second regions 223B. In particular, the examples in FIGS. 10D and 10E are similar to those in FIGS. 10B and 10C, respectively, but with wider first regions 223A due to lateral diffusion of the metal $\tilde{M}$. The examples in FIGS. 10F and 10G are similar to those in FIGS. 10D and 10E, respectively, but with slanted sidewalls 223AS for the first regions 223A. In other words, each of the first regions 223A in the FIGS. 10F and 10G has a width that decreases as the first region 223A extends toward the ferroelectric film 211. As yet another example, each individual region of the crystalline material 223 may have a rounded shape (e.g., an oval, or a circular shape) or an irregular shape.

Figure 10J:
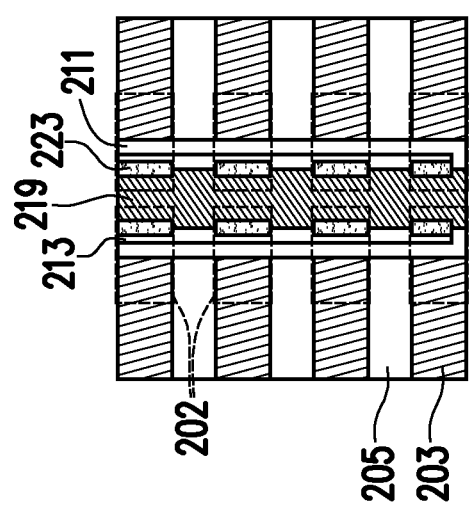

FIGS. 10H, 10I, and 10J illustrate cross-sectional views of the memory device 200 of FIG. 10A along cross-sections A-A, B-B, and C-C, respectively. The cross-sections A-A, B-B, and C-C each cuts along a plane perpendicular to the major upper surface of the substrate 50.

In FIGS. 10H and 10I, the ferroelectric film 211 has a U-shaped cross-section. The channel material 213 has a U-shaped cross-section in FIG. 10I. In FIG. 10J, the bottom portion of the ferroelectric film 211 is removed by the etching process to form the openings for SLs 219S and BLs 219D. In other words, the SLs 219S and the BLs 219D extend through the layer stack 204, which allows easy electrical connection to underlying electrical components (e.g., transistors) formed in the substrate 50. In FIG. 10J, due to the anisotropic etching, the sidewall of the channel material 213 is vertically aligned with the respective sidewall of the ferroelectric film 211. FIG. 10J further illustrates the crystalline material 223 formed by the thermal treatment 220.

Additional processing may follow the processing of FIGS. 10A-10J to complete the memory device 200. For example, the staircase shaped regions 250 (see FIG. 2) may be formed by a plurality of etching steps, and contact plugs may be formed to electrically couple to the WLs 203, BLs 219D, and SLs 219S. Any suitable formation methods for forming the staircase shaped region 250 and the contact plugs may be used.

In an embodiment, to form the staircase-shaped region 250 (see FIG. 2), a patterned photoresist with a first width (e.g., along the longitudinal direction of the WL 205) is formed over the topmost conductive layer 203, and a first anisotropic etching process is performed to pattern the topmost conductive layer 203 and to expose the topmost dielectric layer 205. In other words, the first anisotropic etching process stops when the upper surface of the topmost dielectric layer 205 is exposed. Next, the width of the patterned photoresist is reduced (e.g., by a photoresist trimming process), and a second anisotropic etching process is performed to etch expose portions of underlying layers (e.g., the topmost dielectric layer 205 and the topmost conductive layer 203). The second anisotropic etching process stops when the upper surface of the second topmost conductive layer 203 is exposed. The above described processes repeats, with the width of the patterned photoresist being reduced for each additional anisotropic etching process, until the upper surface of the lowermost conductive layer 203 in FIG. 2 is exposed. The patterned photoresist may then be removed, e.g., by an ashing or stripping process.

Embodiments may achieve advantages. In a typical memory device, the interface between the gate (e.g., WL 203) and the channel material (e.g., OS layer 213) may form a Schottky barrier, which may impede the transfer of electrons, thus increasing the energy needed to overcome this barrier. As feature size continues to shrink in advanced semiconductor manufacturing nodes, the contact resistance between the gate and the channel material is another issue that affects the driving capability of the transistor 201 of the memory cell 202. In addition, it is difficult to find a channel material that achieves a good tradeoff between conductor-like behavior and insulator-like behavior. The structures, materials, and formation methods disclosed herein help to reduce or alleviate the above mentioned issues. For example, the thermal treatment 220 reduces the concentration of $InO_x$ in the channel material 213, and converts portions of the channel material 213 into a crystalline material 223, which has lower electrical resistance than the amorphous channel material 213 and has a higher carrier concentration, thereby reducing the contact resistance between the gate and the channel material and improving the driving capability of the transistor 201 of the memory cell 202. The metal oxide $\tilde{M}O$ in the crystalline material 223 further reduces the electrical resistance of the channel material, thus further improving the contact resistance and driving capability of the transistor 201.

The disclosed embodiments also advantageously alleviate the short channel effect. As device feature continues to shrink in advanced manufacturing nodes, short channel effect becomes a factor limiting the performance of the semiconductor device formed. The embodiments disclosed herein help to reduce or alleviate the short channel effect. For example, the arrow 222 in FIG. 10B illustrates an example path for an electrical current flowing between the BL 219D and the SL 219S (e.g., between the source/drain regions) of the transistor 201 of the memory cell 202. Note that due to the lower contact resistance of the crystalline material 223, the electrical current follows a path indicate by the arrow 222 (which is a longer path) instead of a direct, shorter, path between the source/drain regions if the crystalline material 223 were not formed. The longer current path indicated by the arrow 222 therefore help to alleviate the short channel effect.

Figure 11:
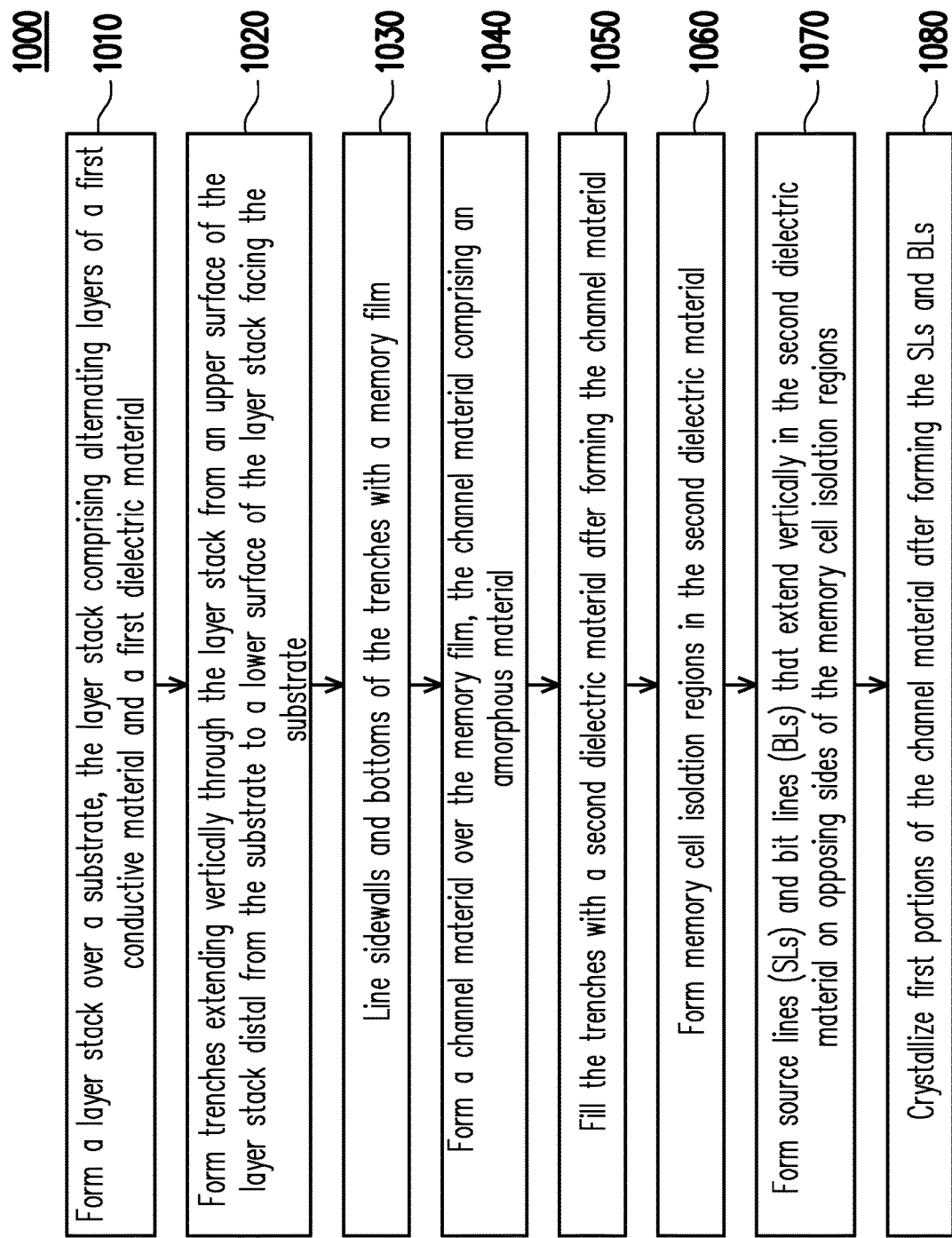
FIG. 11 illustrates a flow chart of a method of forming a three-dimensional (3D) memory device, in some embodiments.

FIG. 11 illustrates a method 1000 of forming a three-dimensional (3D) memory device, in some embodiments. It should be understood that the embodiment method shown in FIG. 11 is merely an example of many possible embodiment methods. One of ordinary skill in the art would recognize many variations, alternatives, and modifications. For example, various steps as illustrated in FIG. 11 may be added, removed, replaced, rearranged, or repeated.

Referring to FIG. 11, at block 1010, a layer stack is formed over a substrate, the layer stack comprising alternating layers of a first conductive material and a first dielectric material. At block 1020, trenches are formed that extend vertically through the layer stack from an upper surface of the layer stack distal from the substrate to a lower surface of the layer stack facing the substrate. At block 1030, sidewalls and bottoms of the trenches are lined with a memory film. At block 1040, a channel material is formed over the memory film, the channel material comprising an amorphous material. At block 1050, the trenches are filled with a second dielectric material after forming the channel material. At block 1060, memory cell isolation regions are formed in the second dielectric material. At block 1070, source lines (SLs) and bit lines (BLs) are formed that extend vertically in the second dielectric material on opposing sides of the memory cell isolation regions. At block 1080, first portions of the channel material are crystallized after forming the SLs and BLs.

In accordance with an embodiment, a method of forming a three-dimensional (3D) memory device includes: forming a layer stack over a substrate, the layer stack comprising alternating layers of a first conductive material and a first dielectric material; forming trenches extending vertically through the layer stack from an upper surface of the layer stack distal from the substrate to a lower surface of the layer stack facing the substrate; lining sidewalls and bottoms of the trenches with a memory film; forming a channel material over the memory film, the channel material comprising an amorphous material; filling the trenches with a second dielectric material after forming the channel material; forming memory cell isolation regions in the second dielectric material; forming source lines (SLs) and bit lines (BLs) that extend vertically in the second dielectric material on opposing sides of the memory cell isolation regions; and crystallizing first portions of the channel material after forming the SLs and BLs. In an embodiment, crystallizing first portions of the channel material comprises converting the first portions of the channel material from the amorphous material into a crystalline material, wherein the first portions of the channel material contact the SLs or the BLs. In an embodiment, crystallizing first portions of the channel material comprise performing a thermal process. In an embodiment, the thermal process is performed at a temperature between about 300° C. and about 400° C. In an embodiment, second portions of the channel material disposed laterally between the SLs and the BLs remain the amorphous material after the thermal process. In an embodiment, the channel material comprises indium zinc compound oxide ($In_xZn_yM_zO$), wherein x, y, and z have values between zero and one, and M is Ti, Ta, Al, Ga, Si, or Mg. In an embodiment, after the thermal process, the crystallized first portions of the channel material extend from the SLs or the BLs to the memory film. In an embodiment, after the thermal process, third portions of the channel material disposed between the crystallized first portions of the channel material and the memory film remain the amorphous material. In an embodiment, the BLs and the SLs comprise a second conductive material, wherein performing the thermal process forms an oxide of the second conductive material in the crystallized first portions of the channel material. In an embodiment, performing the thermal process also forms the oxide of the second conductive material in the BLs and SLs. In an embodiment, the channel material diffuses into the BLs and SLs by the thermal process to form crystallized channel material in the BLs and SLs.

In accordance with an embodiment, a method of forming a three-dimensional (3D) memory device includes: forming a layer stack over a substrate, the layer stack comprising layers of a first conductive material interleaved with layers of a first dielectric material; forming a trench through the layer stack; conformally forming a memory film in the trench; conformally forming a channel material in the trench over the memory film, the channel material comprising an amorphous material; filling the trench with a second dielectric material after conformally forming the channel material; forming source lines (SLs) and bit lines (BLs) in the second dielectric material, the SLs and the BLs extending through the layer stack along a vertical direction perpendicular to a major upper surface of the substrate; and after forming the SLs and BLs, converting first portions of the channel material into a crystalline material by performing a thermal process. In an embodiment, the first portions of the channel material physically contact the SLs or BLs. In an embodiment, a second conductive material of the SLs and BLs diffuses into the first portions of the channel material by the thermal process to induce crystallization of the first portions of the channel material, wherein the channel material diffuses into the SLs and BLs by the thermal process and forms crystallized channel material in the SLs and BLs. In an embodiment, the thermal process forms an oxide of the second conductive material in the first portions of the channel material and in first regions of the SLs and BLs contacting the channel material. In an embodiment, the first portions of the channel material physically contact the memory film.

In accordance with an embodiment, a memory device includes: a layer stack over a substrate, the layer stack comprising alternating layers of word lines and a first dielectric material; a second dielectric material embedded in the layer stack and extending vertically in the layer stack along a direction perpendicular to a major upper surface of the substrate; source lines (SLs) and bit lines (BLs) in the second dielectric material and extending vertically through the layer stack; a memory film between the layer stack and the second dielectric material; and a channel layer comprising a channel material, wherein first portions of the channel layer are disposed between the memory film and the SLs or between the memory film and BLs, wherein second portions of the channel layer are disposed between the memory film and the second dielectric material, wherein the first portions of the channel layer comprises a crystalline material of the channel material, and the second portions of the channel layer comprises an amorphous material of the channel material. In an embodiment, third portions of the channel layer are disposed between the memory film and the first portions of the channel layer, wherein the third portions of the channel layer comprise the amorphous material of the channel material. In an embodiment, the first portions of the channel layer physically contact the memory film. In an embodiment, the BLs and SLs comprise a conductive material, wherein the first portions of the channel layer comprise an oxide of the conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
a layer stack over a substrate, the layer stack comprising alternating layers of word lines (WLs) and a first dielectric material;
a second dielectric material embedded in the layer stack and extending vertically in the layer stack along a direction from an upper surface of the layer stack distal from the substrate to a lower surface of the layer stack facing the substrate;
a source line (SL) and a bit line (BL) in the second dielectric material and extending vertically through the layer stack;
a memory film between the layer stack and the second dielectric material; and
a channel layer between the memory film and the second dielectric material, wherein a first portion of the channel layer is disposed between the memory film and the SL, a second portion of the channel layer is disposed between the memory film and the BL, and a third portion of the channel layer is disposed laterally between the first portion of the channel layer and the second portion of the channel layer, wherein the first portion of the channel layer and the second portion of the channel layer comprise a crystalline channel material, and the third portion of the channel layer comprises an amorphous channel material.

2. The memory device of claim 1, wherein the first portion of the channel layer extends continuously from the SL to the memory film, and the second portion of the channel layer extends continuously from the BL to the memory film.

3. The memory device of claim 2, wherein a distance between the first portion of the channel layer and the second portion of the channel layer remains a same as the first portion of the channel layer extends from the SL toward the memory film.

4. The memory device of claim 2, wherein a distance between the first portion of the channel layer and the second portion of the channel layer increases as the first portion of the channel layer extends from the SL toward the memory film.

5. The memory device of claim 1, wherein a fourth portion of the channel layer is disposed between the memory film and the first portion of the channel layer, and a fifth portion of the channel layer is disposed between the memory film and the second portion of the channel layer, wherein the fourth portion of the channel layer and the fifth portion of the channel layer comprise the amorphous channel material.

6. The memory device of claim 1, wherein the BL and SL comprise an electrically conductive material, wherein the first portion of the channel layer and the second portion of the channel layer further comprise an oxide of the electrically conductive material.

7. The memory device of claim 6, wherein the SL comprises a first region contacting the channel layer and a second region laterally distal from the channel layer, wherein the first region of the SL comprises the crystalline channel material, and the second region of the SL is free of the crystalline channel material.

8. The memory device of claim 7, wherein the first region of the SL further comprises the oxide of the electrically conductive material, and the second region of the SL is free of the oxide of the electrically conductive material.

9. The memory device of claim 8, wherein a concentration of the crystalline channel material in the first portion of the channel layer and in the first region of the SL decreases along a first direction from the channel layer toward the SL.

10. The memory device of claim 9, wherein a concentration of the oxide of the electrically conductive material in the first portion of the channel layer and in the first region of the SL increases along the first direction.

11. The memory device of claim 1, wherein the memory film comprises a ferroelectric material, and the crystalline channel material comprises crystalline indium zinc compound oxide ($In_xZn_yM_zO$), wherein x, y, and z have values between zero and one, and M is Ti, Ta, Al, Ga, Si, or Mg.

12. A memory device comprising:
a layer stack over a substrate, the layer stack comprising alternating layers of a first conductive material and a first dielectric material;
a second dielectric material in the layer stack and extending vertically from an upper surface of the layer stack distal from the substrate toward a lower surface of the layer stack facing the substrate;
a conductive line in the second dielectric material and extending vertically through the layer stack;

a ferroelectric film between the layer stack and the second dielectric material; and a channel layer between the ferroelectric film and the second dielectric material, wherein a first region of the channel layer contacting the conductive line comprises a crystalline channel material, and a second region of the channel layer laterally adjacent to the first region of the channel layer comprises an amorphous channel material.

13. The memory device of claim 12, wherein the conductive line is a bit line (BL) or a source line (SL) of the memory device.

14. The memory device of claim 12, wherein the first region of the channel layer contacts the ferroelectric film.

15. The memory device of claim 12, wherein the first region of the channel layer is separated from the ferroelectric film by a third region of the channel layer, wherein the third region of the channel layer comprises the amorphous channel material.

16. The memory device of claim 12, wherein the first region of the channel layer further comprises an oxide of a metal material of the conductive line.

17. The memory device of claim 16, wherein a first region of the conductive line contacting the first region of the channel layer comprises the crystalline channel material and the oxide of the metal material.

18. The memory device of claim 17, wherein a concentration of the crystalline channel material in the first region of the channel layer and in the first region of the conductive line decreases along a first direction from the channel layer toward the conductive line, wherein a concentration of the oxide of the metal material in the first region of the channel layer and in the first region of the conductive line increases along the first direction.

19. A memory device comprising:

a layer stack over a substrate, the layer stack comprising alternating layers of a first conductive material and a first dielectric material;

a second dielectric material in the layer stack and extending vertically from an upper surface of the layer stack distal from the substrate toward a lower surface of the layer stack facing the substrate;

a conductive line in the second dielectric material and extending vertically through the layer stack;

a ferroelectric film between the layer stack and the second dielectric material; and a channel layer between the ferroelectric film and the second dielectric material, wherein a first region of the channel layer contacting the conductive line comprises a crystalline channel material and an oxide of a metal material of the conductive line, wherein a second region of the channel layer laterally adjacent to the first region of the channel layer comprises an amorphous channel material and is free of the oxide of the metal material, wherein a first region of the conductive line contacting the first region of the channel layer comprises the crystalline channel material and the oxide of the metal material.

20. The memory device of claim 19, wherein a concentration of the crystalline channel material in the first region of the channel layer and the first region of the conductive line decreases along a first direction from the channel layer toward the conductive line, wherein a concentration of the oxide of the metal material in the first region of the channel layer and the first region of the conductive line decreases along a second direction from the conductive line toward the channel layer.

* * * * *